US006423565B1

(12) United States Patent
Barth et al.

(10) Patent No.: US 6,423,565 B1
(45) Date of Patent: Jul. 23, 2002

(54) APPARATUS AND PROCESSES FOR THE MASSPRODUCTION OF PHOTOVOTAIC MODULES

(76) Inventors: Kurt L. Barth, 1205 W. Elizabeth #E164, Fort Collins, CO (US) 80521; Robert A. Enzenroth, 112 Rutgers #203; Walajabad S. Sampath, 1612 Faraday Cir., both of Fort Collins, CO (US) 80525

( * ) Notice: Subject to any disclaimer, the term of this patent is extended or adjusted under 35 U.S.C. 154(b) by 15 days.

(21) Appl. No.: 09/583,381

(22) Filed: May 30, 2000

(51) Int. Cl.[7] ............................................. H01L 21/00

(52) U.S. Cl. ............................ 438/57; 438/60; 438/95; 136/260; 136/264

(58) Field of Search .............................. 438/57, 58, 59, 438/60, 61, 62, 63, 95, 603; 427/255.31, 126.1; 136/260, 264; 117/109

(56) References Cited

U.S. PATENT DOCUMENTS

| | | | |
|---|---|---|---|
| 3,294,670 A | 12/1966 | Charschan et al. | 204/298 |
| 3,636,919 A | 1/1972 | Bozler | 118/48 |
| 3,787,961 A * | 1/1974 | Tomiwa | |
| 4,017,773 A * | 4/1977 | Cheseldine | |
| 4,319,069 A | 3/1982 | Tyan | 136/258 |
| 4,336,285 A * | 6/1982 | Squillante | |
| 4,734,381 A | 3/1988 | Mitchell | 437/5 |
| 5,304,499 A | 4/1994 | Bonnet et al. | 437/5 |
| 5,393,675 A | 2/1995 | Compaan | 437/5 |
| 5,472,910 A | 12/1995 | Johnson et al. | 437/185 |
| 5,501,744 A | 3/1996 | Albright et al. | 136/258 |
| 5,536,333 A | 7/1996 | Foote et al. | 136/260 |
| 5,714,391 A | 2/1998 | Omura et al. | 437/5 |
| 6,251,701 B1 * | 6/2001 | McCandless | |

OTHER PUBLICATIONS

Meyers, Peter V. "High temperature vapor deposition of thin film CdTe PV Modules" American Inst. of Physics Conf. Proc. pp. 250–254, Dec. 1992.*
Nakayama et al., "Ceramic Thin Film CdTe Solar Cell," Japan J. Appl. Phys. vol. 15, No. 11 (1976).
Zweibel et al., "CuInSe$_2$ and CdTe: Scale–Up for Manufacturing, "SERI/TR–211–3571 pp. 79–82 (Dec., 1989).
Bonnet et al., High–Rate Deposition of High–Quality CdTe Films for High–Efficiency Solar Cells, CH2953–8/91/0000–1165 IEEE, pp. 1165–1168 (1991).
Bonnet, "The CdTe Thin Film Solar Cell," Internation Journal of Solar Energy, pp. 1–14, vol. 12 (1992).
Myers, "High Temperature Vapor Deposition of Thin Film CdTe PV Modules," American Institute of Physics Conference Proceedings, pp. 250–254 (Dec., 1992).

(List continued on next page.)

Primary Examiner—Caridad Everhart
(74) Attorney, Agent, or Firm—William E. Hein

(57) ABSTRACT

An apparatus and processes for large scale inline manufacturing of CdTe photovoltaic modules in which all steps, including rapid substrate heating, deposition of CdS, deposition of CdTe, CdCl$_2$ treatment, and ohmic contact formation, are performed within a single vacuum boundary at modest vacuum pressures. A p+ ohmic contact region is formed by subliming a metal salt onto the CdTe layer. A back electrode is formed by way of a low cost spray process, and module scribing is performed by means of abrasive blasting or mechanical brushing through a mask. The vacuum process apparatus facilitates selective heating of substrates and films, exposure of substrates and films to vapor with minimal vapor leakage, deposition of thin films onto a substrate, and stripping thin films from a substrate. A substrate transport apparatus permits the movement of substrates into and out of vacuum during the thin film deposition processes, while preventing the collection of coatings on the substrate transport apparatus itself.

42 Claims, 14 Drawing Sheets

OTHER PUBLICATIONS

Barth et al., "Air to Vacuum to Air (AVA) Transport Systems," Proceedings of the Eigth International Vacuum Web Coating Confrence (1994).

Bohn et al., "RF Sputtered Films of Cu–Doped and N–Doped ZnTe," IEEE First WCPEC, pp. 354–356 (1994).

Bonnet et al., "The CTS Thin Film Solar Module–Closer to Production," 13th European Photovoltaic Solar Energy Conference, pp. 1457–1460, (1995).

Barth et al., "Continuous Belt Air to Vacuum to Air (AVA) Processing of Thin Films and Devices," System Integration poster displayed at NSF Grantees Conference (1998).

Ferekides et al., "RF Sputtered Back Contacts for CdTe/CdS Thin Film Solar Cells," 26th IEEE PVSC (1997).

Uda et al., "Properties of CdS/CdTe Solar Cells with $C_2Te$–Au Contacts," Japan J. Appl. Phys., vol. 36, Part I, No. 9A, pp. 5549–5550 (1997).

Sasala et al., "Technology Support for Initiation of High–Throughput Processing of Thin–Film CdTe PV Modules," NREL/SR–520–23542, pp. 1–2 and 12, (1997).

* cited by examiner

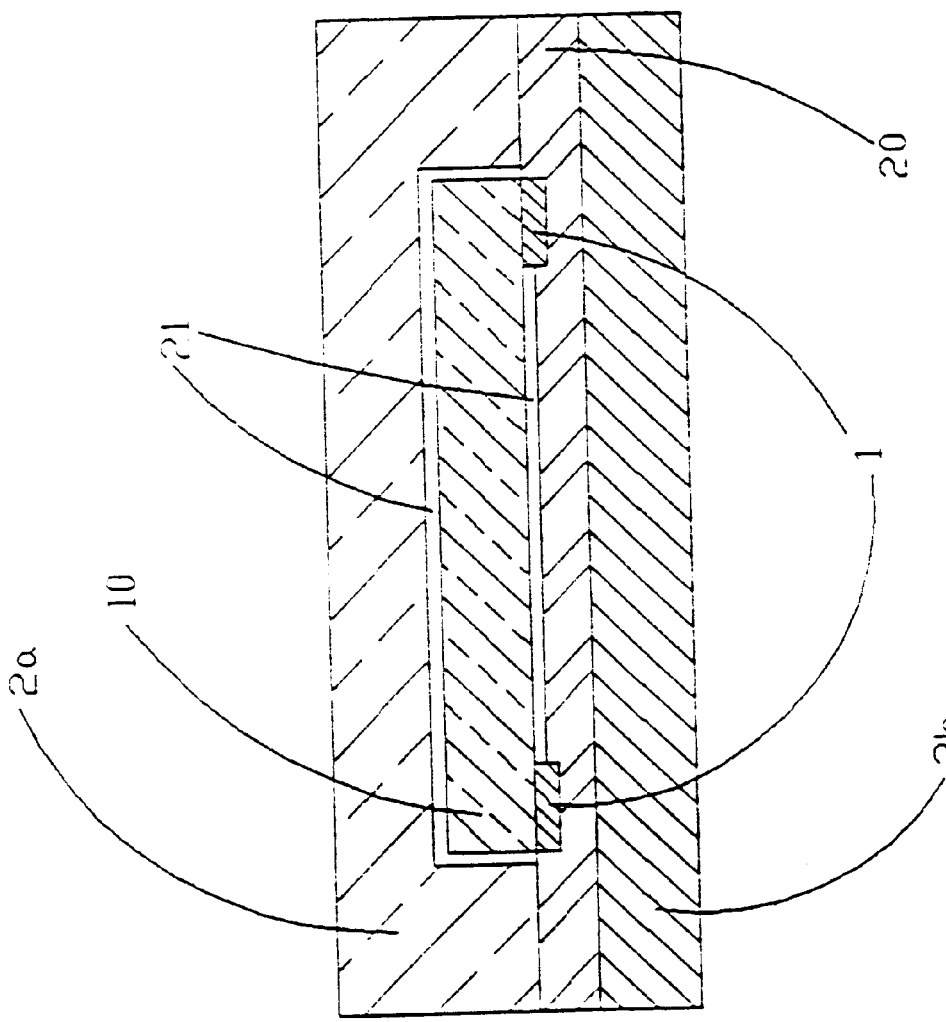

APPARATUS AND PROCESSES FOR THE MASSPRODUCTION OF PHOTOVOTAIC MODULES

GOVERNMENT SUPPORT

This invention was made with Government support under grants awarded by the National Science Foundation and the Department of Energy. The Government has certain rights in this invention.

FIELD OF THE INVENTION

The present invention relates to apparatus and processes for the mass production of low cost photovoltaic modules and, more specifically to an inline continuous vacuum apparatus and process for fabricating the critical semiconductor layers, which together with attendant non-vacuum processes, are all accomplished at high throughput.

BACKGROUND OF THE INVENTION

Photovoltaic (PV) modules are used to generate electricity from sunlight by the photovoltaic effect. It has been recognized for decades that if these modules could be mass produced at low cost, they could be used to meet a considerable portion of the world's energy needs. Major companies, such as Royal Dutch/Shell and BP-Amoco, have stated that PV modules have the potential to become a major energy source and that their use has significant benefits to the global environment. However, for these benefits to be realized, PV modules must be produced at many times the current volume and at costs below \$100/m$^2$, as discussed by Bonnet et. al. in "Cadmium-telluride material for thin film solar cells", J. Mater. Res., Vol. 13, No. 10 (1998). Currently, PV modules are manufactured in small quantities at costs of about \$500/m$^2$. About one hundred times the current yearly production is required to sustain a PV module manufacturing capacity that can contribute just 5% of the current electricity generated. Consequently, the manufacturing volume of PV modules needs to be greatly increased and costs significantly reduced.

To realize the required increases in production volume and decreases in manufacturing costs, PV modules must be produced as a commodity. Commodity level manufacturing requires innovation to develop highly automated production processes and equipment, which are designed to specifically fabricate the commodity product. Commodity manufacturing necessitates high production speeds (high throughput), minimal labor costs, and a continuous process flow. Low capital costs and ease of expanding production capacity also facilitate commodity manufacturing. There are a variety of known PV devices, but only the cadmium telluride (CdTe) thin film PV device has the potential to satisfy the requirements for commodity manufacturing.

Since 1974, there have been many industrial efforts to create technologies for CdTe PV module manufacturing. Most of these industrial efforts, as exemplified by the teachings of U.S. Pat. Nos. 4319069, 4734381, and 5501744, have been terminated because of fundamental inadequacies in their manufacturing technologies. To date, no technology suitable for commodity level manufacturing of CdTe PV modules has been developed, thus demonstrating the need for innovation in this area.

The most common CdTe PV cells are thin film polycrystalline devices, in which the CdTe layer is paired with a cadmium sulfide (CdS) layer to form a heterojunction. The thin films of a CdS/CdTe PV device can be produced through a variety of vacuum and non-vacuum processes. Of the many types of thin film deposition methods, sublimation in vacuum is most amenable to commodity manufacturing. This is because vacuum sublimation of CdS/CdTe PV modules exhibits deposition rates 10 to 100 times higher than any other PV module deposition method. Vacuum sublimation of the semiconductor layers for CdS/CdTe PV modules can also be performed in modest vacuum levels and does not require costly high vacuum equipment. Vacuum deposition methods for other thin film PV devices require costly, complex high vacuum equipment and results in low throughput.

Due to the high rate of deposition and low capital cost, the CdS/CdTe thin film cell fabricated by vacuum sublimation is the most suitable for commodity level manufacturing of PV modules. However, cadmium is a Group B carcinogen. According to U.S. government regulations, the quantity of this material which can be lawfully released into the environment or into an occupational setting is extremely small. The known prior art in CdS/CdTe vacuum sublimation requires process and hardware innovations to achieve occupational and environmental safety as required by federal regulations, as well as commodity scale manufacturing.

One known configuration for a CdTe device is the back wall configuration, in which the thin films are deposited onto a glass superstrate, hereinafter referred to as a substrate. The CdTe device is most often fabricated on a glass substrate coated with a transparent conductive oxide (TCO) film onto which other film layers are deposited in the following order: a) a CdS film, b) a CdTe film, c) an ohmic contact layer, and d) a metal film. Along with the deposition of these films, many heat treatments are also needed to enhance the device properties. The TCO and the metal films form the front and back electrodes, respectively. The CdS layer (n-type) and the CdTe layer (p-type) form the p/n junction of the device. The cells are deployed with the substrate facing the sun. Photons travel through the glass and TCO film before reaching the p/n junction of the device. A module is formed by interconnecting individual cells in series to produce a useful voltage.

Thus, a process for manufacturing CdS/CdTe modules includes the following steps: 1) cleaning the TCO coated glass substrates, 2) heating the substrates, 3) depositing an n-type CdS layer, 4) depositing a p-type CdTe layer, 5) performing a $CdCl_2$ treatment to improve CdTe grain structure and electrical properties, 6) forming a p+ ohmic low resistance contact layer to improve current collection from the CdTe, 7) depositing a metal layer (metallization) to form the back electrode, 8) scribing the film layers into individual cells, 9) interconnecting the cells in series and providing a means of electrical connection to the module, and 10) encapsulating the finished module.

All of the prior art methods for the production of CdTe modules have limitations that render them unsuitable for commodity level manufacturing. For example, prior art methods of $CdCl_2$ treatment are disconnected, low throughput batch operations, rather than continuous flow processes. These batch type processes are inefficient and involve extremely high costs in order to increase throughput to the commodity manufacturing level. Most of the known methods of $CdCl_2$ treatment also require rinsing, which generates liquid wastes that contain cadmium Known methods of ohmic contact formation are also batch type processes that exhibit low throughput rates. Prior art metallization steps also exhibit low throughput and require costly process equipment. It is necessary to improve the current methods of $CdCl_2$ treatment, ohmic contact formation, and metallization in order to achieve high throughput continuous processes.

Prior art methods for scribing the layers to form a module include laser scribing, mechanical scribing, and abrasive blasting. Known laser scribing methods used in the PV industry are associated with low production speed and high capital cost. Laser scribing was abandoned recently in one industrial setting due to laser equipment failure as discussed by Borg in, "Commercial Production of Thin-Film CdTe Photovoltaic Modules", NREL/SR-520-23733, October. 1997. Known mechanical and abrasive blast scribing methods have only been shown on a small scale as typified by U.S. Pat. No. 5,501,744 to Albright and require innovation and improvement to be suitable for commodity level manufacturing.

Specific examples of prior art relating to CdS deposition and CdTe deposition performed by vacuum sublimation are described in detail below. The other prior art steps that are necessary to form a complete CdTe PV module are also discussed below.

One known vacuum method of producing CdTe solar cells by vacuum sublimation is taught in U.S. Pat. No. 5,536,333 to Foote et. al. This method is further described by Sasala et. al. in "Technology Support for Initiation of High-Throughput Processing of Thin-Film CdTe PV Modules", NREL/SR-520-23542, pp. 1–12, (1997). These references discuss a technique known as vapor transport deposition (VTD), which involves heating of the semiconductor materials in a contained vessel in order to create vapor. An inert carrier gas, such as nitrogen, transports the vapor of the semiconductor to the substrate through heated conduits. The substrate is held horizontally in a heated environment and supported from beneath by ceramic rollers in the heated environment. The deposition of the semiconductor is made onto the top surface of the substrate. In accordance with this prior art method, the ceramic rollers prevent the glass substrate from sagging under its own weight due to the elevated temperatures involved.

The entire VTD method is very complex and costly. It is possible to deposit a complete CdTe solar cell in a very short time and at sufficiently low substrate temperatures to eliminate glass sagging completely or reduce it to a very small acceptable value. Thus, the expensive ceramic rollers of the VTD method are not needed. Reloading starting material may also be performed in a much simple manner than as shown in this prior art. Since the films are thin, only small amounts of material are required to form them Consequently, only very small volumes of starting material are needed for many days of operation, thus eliminating the need for this complex reloading arrangement. The heated vessels of this method contain toxic vapors, which pose significant occupational safety problems when they are opened for reloading during processing. In the VTD method, vapors are transported through long distances in a carrier gas, an arrangement which will likely lead to the formation of very small nano-particles through condensation of the vapors. These nano-particles degrade the film qualities and lead to occupational hazards when the system is serviced. Furthermiore, in the VTD method, the continuous flow of carrier gas has to be maintained along the substrate. Any CdS or CdTe vapors that are carried past the substrate will be wasted. Any deposits of waste material on the inner surface of the vacuum chamber, pumps, exhaust, etc. must be cleaned, thereby exposing maintenance workers to toxic materials and raising occupational safety issues. In order to prevent unwanted condensation of CdS and CdTe vapors, the VTD method also requires continued heating of large portions of the equipment, including the vaporization vessel itself, the conduits, the deposition chamber, etc. This wastes energy and increases the capital costs. The VTD method is only used for depositing the p/n junction layers. Other processing steps, such as the $CdCl_2$ treatment, ohmic contact formation, and metallization are inherently low throughput batch processes. Scribing is taught to be either laser scribing or photolithography, both of which are slow and costly processes.

In another prior art reference entitled "The CdTe Thin Film Solar Cell," International Journal of Solar Energy, vol. 12, 1992, Bonnet proposes an inline production method for fabricating CdS/CdTe layers using a close-spaced sublimation (CSS) type deposition process. This prior art reference describes inline deposition within one vacuum boundary for only the steps of substrate heating, CdS deposition, and CdTe deposition. The other steps of $CdCl_2$ treatment, ohmic contact formation, and metallization are not shown as part of a continuous inline vacuum process, and are presumably performed by previously known methods. As described above, known methods for performing these steps have limitations. The Bonnet method does allow multiple substrate processing of more than one film However, it is not clear if long term operation and uniformity of deposition over time and across large substrates are achieved. Furthermore, the Bonnet method relies on CSS, which by definition, requires a space of 2–3 mm between the source and the substrate. This gap will allow a vapor leak at the edge of the substrate. As the source charge sublimes away over time the gap will increase. It is the present inventors experience that this gap and the associated vapor leak causes non-uniform deposition on the substrates and also results in condensation of toxic materials on unwanted areas on the inner surfaces of the process chamber. This leak will be reduced if the background chamber pressure is held high enough to decrease the mean free path between gas molecules in the process chamber. However, higher pressures lead to lower deposition rates and greater nano-particle formation. An operating pressure of 750 millitorr is specified. At these pressures, nano-particles will be formed, since the vapor will homogeneously condense in the ambient gas near the edge of the deposition space. These very small particles degrade film quality and pose a health hazard to workers during routine maintenance inside the vacuum chamber.

Each of the individual prior art process steps required to produce a CdTe PV module exhibits limitations, as outlined above. In addition, nothing in the prior art describes an overall process to perform the series of steps of substrate heating, depositing an n-type CdS layer, depositing a p-type CdTe layer, performing a $CdCl_2$ treatment, and forming an ohmic contact inline, continuously, and in one vacuum boundary. In particular, the steps of $CdCl_2$ treatment and ohmic contact formation require significant innovation before they can be included in a continuous inline vacuum process. Such a continuous inline vacuum process would have significant advantages for commodity manufacturing of CdTe PV modules.

Any vacuum process for manufacturing CdTe PV modules would also require an apparatus to transport substrates through the process steps within vacuum and to transport the substrates into and out of vacuum rapidly. This apparatus should be robust, simple, and low cost. The apparatuses described in the prior art simply do not meet these requirements.

BRIEF DESCRIPTION OF THE INVENTION

The present invention is directed to commodity scale manufacturing of CdTe PV modules and involves innovations in both manufacturing processes and hardware.

One aspect of the present invention involves providing all of the processing steps for the critical semiconductor layers of a CdTe PV device inline, with all of those steps being completely performed within one vacuum boundary, at high throughput. They include rapid substrate heating, deposition of CdS, deposition of CdTe. $CdCl_2$ treatment, and ohmic contact formation. These steps are performed at modest vacuum pressures without requiring costly high vacuum equipment. By utilizing inline vacuum processing to form all of the critical layers without breaking vacuum, an improvement in process throughput, film quality, device efficiency, and device stability is realized, while at the same time avoiding pinhole formation. All inline vacuum processing is also advantageous in that it limits the production of toxic waste and environmental and occupational exposure to toxic compounds.

Another aspect of the present invention is a novel $CdCl_2$ treatment step, which may be performed in the same vacuum boundary and inline with the other fabrication steps. Our $CdCl_2$ treatment process has the advantage of a high throughput rate while producing stable, high efficiency devices and, at the same time, limiting environmental and occupational exposure to toxic compounds.

Another aspect of the present invention is a novel vacuum process to produce a p+ ohmic contact region by subliming a metal salt onto a CdTe layer. Our ohmic contact formation process has the advantage of producing, at high throughput rates, a low resistance ohmic contact that is stable over time.

Another aspect of the present invention is a unique high throughput, low cost spray process to form the back electrode. This process has the advantage of producing a durable, high conductivity back electrode using known low cost industrial spray methods.

Another aspect of the present invention is to provide novel high throughput, low cost processes to perform module scribing using abrasive blasting or mechanical brushing through a mask. These novel scribing processes have the advantage of selectively scribing the semiconductor layers without scribing the TCO layer. In addition, the scribe process may be adjusted so that the TCO layer may be removed as well.

Another aspect of the present invention is a novel vacuum process station to selectively heat substrates and films, to expose substrates and films to vapor, to deposit thin films on a substrate, and to strip thin films off of a substrate. This vacuum process station allows substrates to be transported into and out of vacuum. When used as a deposition source, our vacuum process station has the advantage of very minimal vapor leakage, which significantly reduces occupational exposure to toxic materials. This unique deposition source deposits very uniform layers and is suitable for long term continuous operation.

Another aspect of the present invention is a novel substrate transport apparatus, which is employed to move substrates within vacuum or, in combination with a unique opening, to transport substrates rapidly into and out of vacuum This substrate transport apparatus is robust, simple, and low cost and has the additional advantage of not collecting any coatings as it moves substrates through the thin film deposition processes.

Yet another aspect of the present invention is to provide substrate cleaning in a clean mini-environment at the entrance to the inline continuous vacuum process, which has the advantage of greatly reduced cost resulting from the elimination of a clean room to contain the entire process line.

BRIEF DESCRIPTION OF THE DRAWINGS

FIG. 3 is a schematic elevation view in cross section along the line 60—60 of FIG. 2A illustrating the sealing arrangement by which the introduction of outside air into the vacuum chamber is minimized.

DETAILED DESCRIPTION OF THE PREFERRED EMBODIMENT

Figure 1:
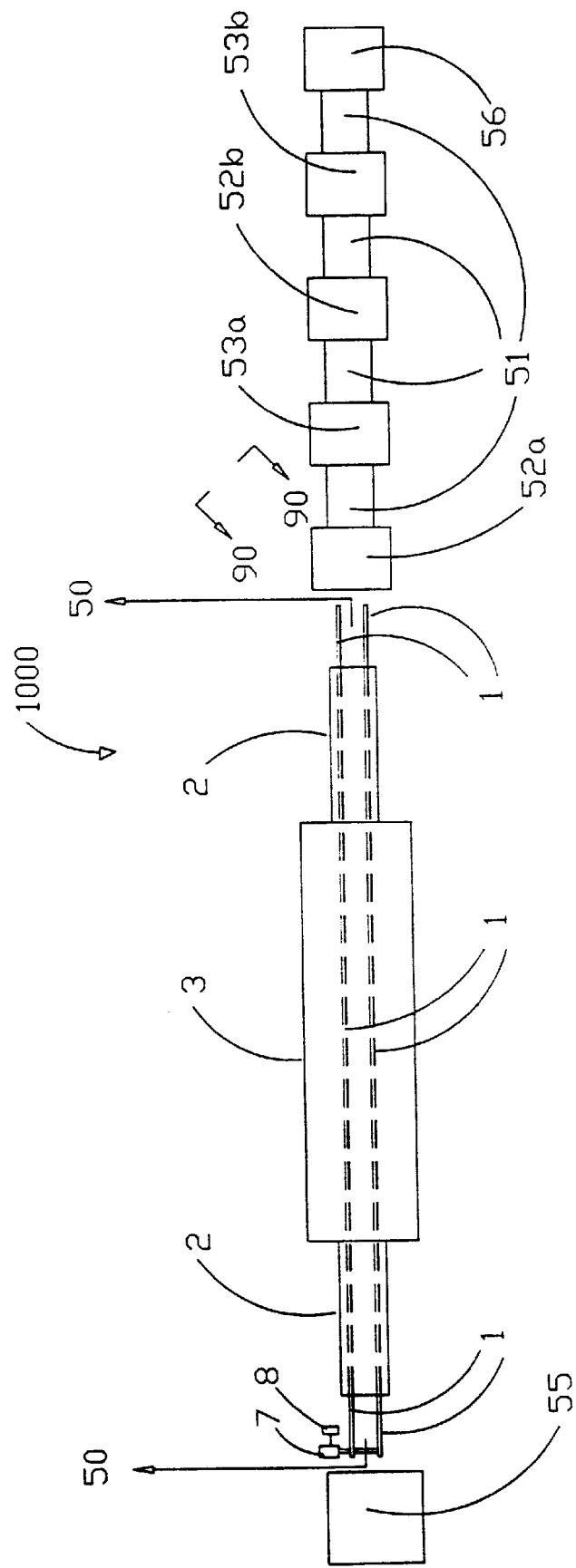
FIG. 1 is a schematic top plan view of a system for making photovoltaic modules in accordance with the present invention.

Referring now to FIG. 1, there is shown an overview of the preferred embodiment of an apparatus 1000 for producing photovoltaic modules in accordance with the present invention. A substrate cleaning station 55 cleans the commercially available substrates that typically comprise low cost soda lime glass coated with transparent conducting oxide (TCO). After cleaning, a pair of metal strip belts 1 transport the substrates through the next portion of the apparatus 1000. The belts may be moved bidirectionally by means of a known stepper motor 7. Precise indexing of the position of the pair of belts 1 is accomplished by the use of a commercially available stepper motor controller 8. The pair of metal strip belts 1 pass through a pair of openings 2 and a vacuum chamber 3. A plurality of process stations for the processing of the critical semiconductor layers are contained within the vacuum chamber 3, and are described in detail below. Another series of process stations are linked by a plurality of conveyor belts 51. These process stations do not require vacuum. A first spray process station 52a is followed by a first film scribing process station 53a These process stations are followed by a second spray process station 52b and a second film scribing process station 53b. The final process station in the apparatus 1000 is an encapsulation station 56. The description of the apparatus and processes of the instant invention is presented in the following order: the substrate transport apparatus and openings, the vacuum process stations, the metallization method, the film scribing method, and the process steps to produce a photovoltaic module. Following the description of the preferred embodiment is a description of alternate embodiments.

Figure 2A:
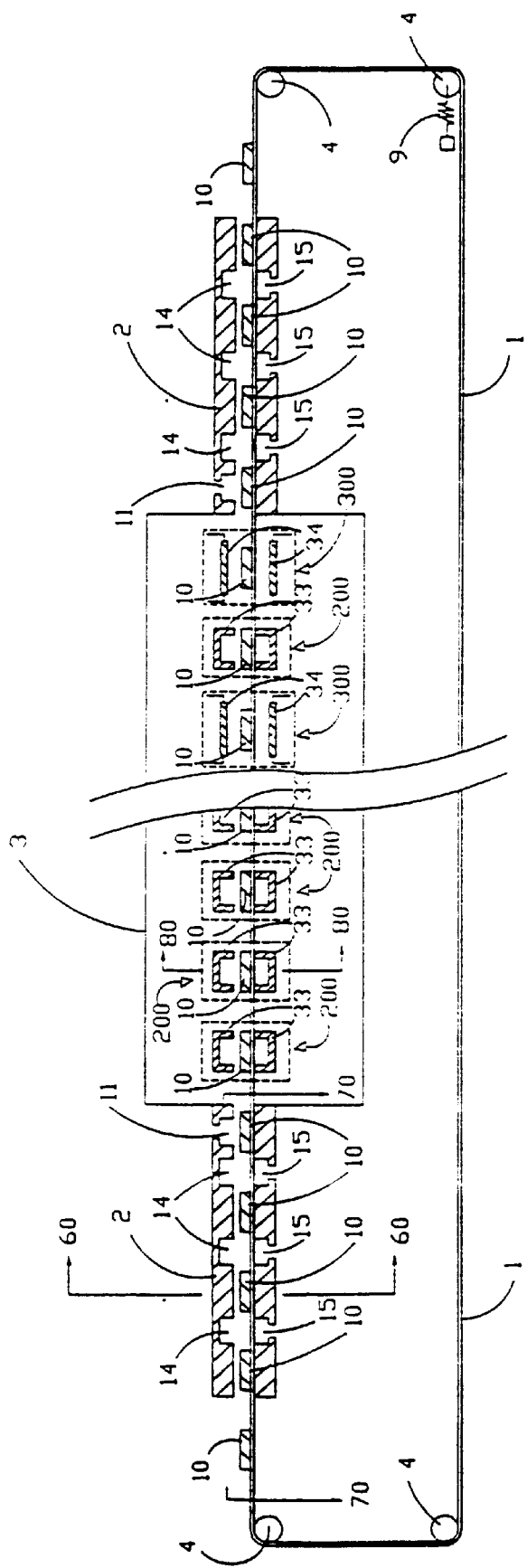
FIG. 2A is a partially broken away schematic elevation view in longitudinal section along the line 50—50 of FIG. 1, illustrating a substrate transport apparatus and a plurality of vacuum processing stations.

FIGS. 2A, 3, 4, and 5 in combination illustrate the complete assembly of the preferred embodiment of a pair of air-to-vacuum-to-air (AVA) openings and the substrate transport system of the present invention. The pair of AVA openings 2 facilitate the rapid transport of substrates from air into vacuum and then back into air. FIG. 2A illustrates vacuum chamber 3, which is pumped to a suitable vacuum by known techniques. A pair of AVA openings 2 is shown on either side of the vacuum chamber 3. A pair of continuous metal strip belts 1 pass through both of the AVA openings 2 and also through the entire length of the vacuum chamber 3. A plurality of substrates 10, which are carried on the twin metal belts 1, are also shown. The AVA openings 2 are shown with a plurality of pockets 14 and a plurality of vacuum pump ports 15 for vacuum pumping. A pair of injection ports 11 are shown for the injection of process gas. A plurality of pulleys 4 are provided for moving the belts 1. A belt tensioner 9 maintains the belts 1 at a predetermined tension.

FIG. 3 shows the details of the AVA openings 2 in cross section. A top channel 2a and a bottom plate 2b are split by a belt bearing plate 20. In total, parts 2a, 2b, and 20 form the cross section of the opening 2 of FIGS. 2A, 3, and 4. A clearance distance 21 on the order of 0.005 in. ±0.002 in. is formed around the substrate 10. This clearance distance 21 is formed between the substrate 10 and the top channel 2a and between the substrate 10 and the belt bearing plate 20. The clearance distance 21 is large enough so that the substrate 10 may move freely, but is small enough to provide resistance to fluid flow through the clearance distance 21. This resistance to fluid flow allows the vacuum chamber 3 to be maintained at a desired vacuum level. The pair of continuous metal strip belts 1 provide a substrate carrier to convey the plurality of substrates 10.

Figure 5:
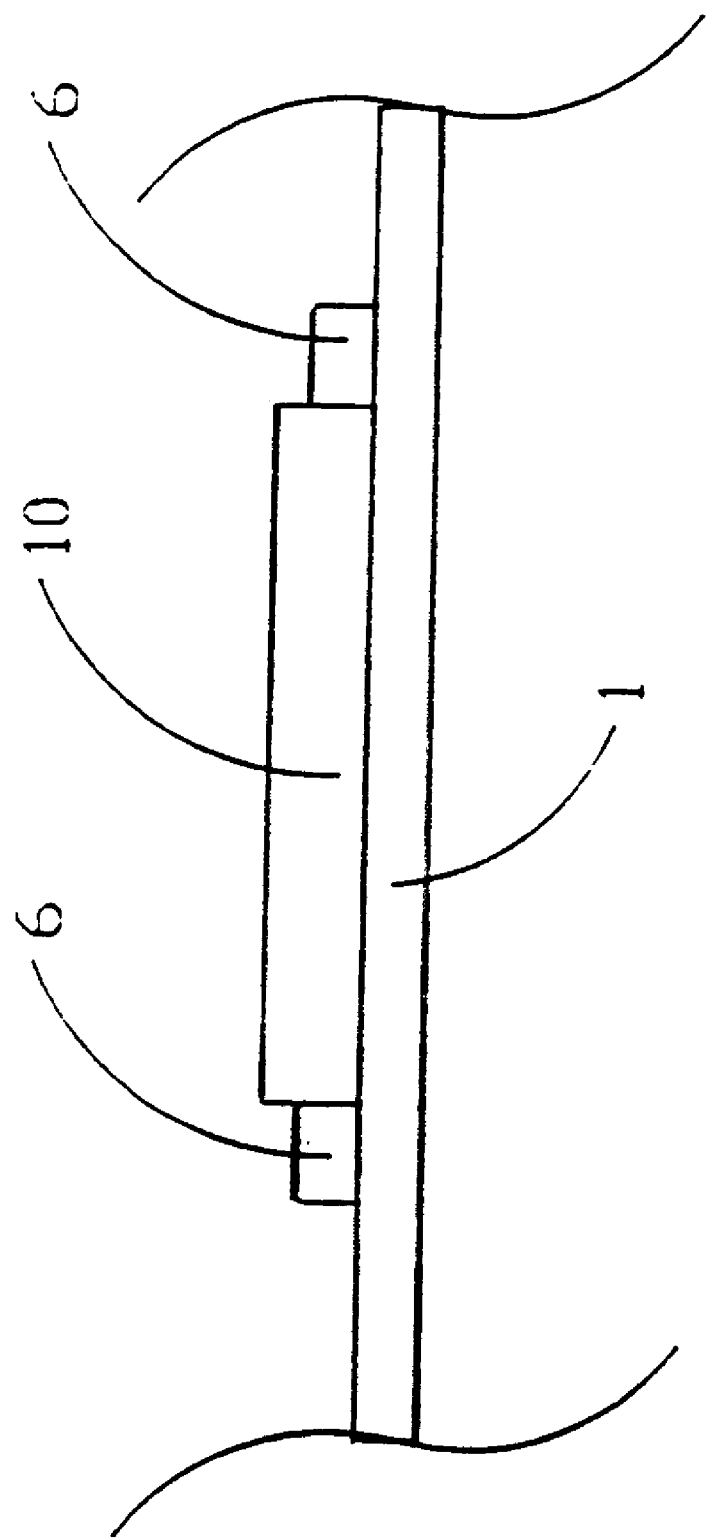
FIG. 5 is a schematic elevation view along the line 100—100 of FIG. 4, further illustrating the substrate transport apparatus of FIG. 2A.

FIG. 5 is a detailed view of a pair of tabs 6 which are attached to the metal strip belt 1. The tabs 6, a plurality of which are placed periodically along the belt 1, provide a means of locating the substrate 10.

The pair of continuous metal strip belts 1 provide a substrate carrier that will not be coated by the vacuum deposition processes. The elimination of coating on the belt 1 is a significant improvement over the prior art. As exemplified by Charschan in U.S. Pat. No. 3,294,670 (1966), the prior art utilized substrate carriers which enclosed the perimeter of the substrate in a "picture frame" type arrangement. The picture frame type substrate carriers are necessarily coated during deposition. These coatings lead to jamming in the close tolerance seals during motion, present occupational safety issues due to particle generation, and result in cross contamination between the processes. In the present invention, these problems have been addressed by exposing only the substrates 10 to coating during a vacuum deposition. In addition, unlike all of the prior art, the clearance distance 21 is not formed between the substrate carrier and the openings. Rather, the clearance distance 21 is formed between the precisely cut substrate 10 and the AVA openings 2. The clearance 21 is formed specifically between the substrate 10 and the top channel 2a and between the substrate 10 and the linear bearing plate 20.

The use of the pair of metal strip belts 1 as the substrate carrier in accordance with the present invention has many other advantages. The fact that the belts 1 have a low mass will create less wear on any bearing surface used. The low mass will also greatly decrease the inertia of the substrate carrier, thus allowing the substrate to be moved quickly between processing stations.

Continuous metal strip belts 1 also have advantages in situations calling for a series of vacuum processes to be carried out in one vacuum chamber 3. Continuous metal strip belts 1 of 200 feet in length can be fabricated by known methods. This allows a large number of process steps to be carried out in one vacuum chamber 3.

Another advantage is the cost of fabrication of this type of substrate carrier, which is considerably less than the cost of machining close tolerance picture frame type substrate carriers of the prior art. The present substrate carriers also facilitate scaling up the process. For larger substrates 10, the openings 2 must be increased in size. However, the strip belts 1 may be simply spaced further apart.

The continuous metal strip belts 1 are preferably formed of metal alloys that have high resistance to corrosion and that retain high strength at elevated temperatures. These belts may be coated with other materials to alter the surface properties further, if needed. Many different attachments or tabs 6 for retaining the substrate 10 may be welded or fixed to the metal strip belts 1 at relatively low cost.

A cut tolerance of ±0.003 inch is required for the glass substrates 10 which are carried on the continuous metal strip belts 1. High throughput, low cost equipment is commercially available for cutting the substrates 10 to the required tolerances. The precision glass cutting required for this invention is not an additional processing step, since the substrates 10 must be cut to size in any method.

The continuous metal strip belts 1 are also relatively small in cross section. The small cross section decreases the thermal expansion as the belts pass through high temperature vacuum processes, which will decrease any tendency to jam in the AVA openings 2 due to thermal expansion.

The relatively low mass of the metal strip belts 1 also allows the substrate carrier to cool and heat more rapidly than the prior art picture frame type substrate carrier. The low mass of the metal strip belts 1 allows the belt temperature to match the glass temperature during processing, thereby reducing thermal gradients in the glass substrates 10 which could otherwise lead to stresses that may crack the glass.

Referring now to FIG. 2A, the vacuum chamber 3 and a plurality of vacuum processing stations, generally indicated by 200 and 300, are illustrated in a partial schematic elevation view in section. The metal strip belts 1 carry the plurality of substrates 10 through the plurality of vacuum processing stations 200 and 300. The process stations 300 provide for cooling of substrates 10 by radiation to a pair of water cooled plates 34.

Figure 7A:
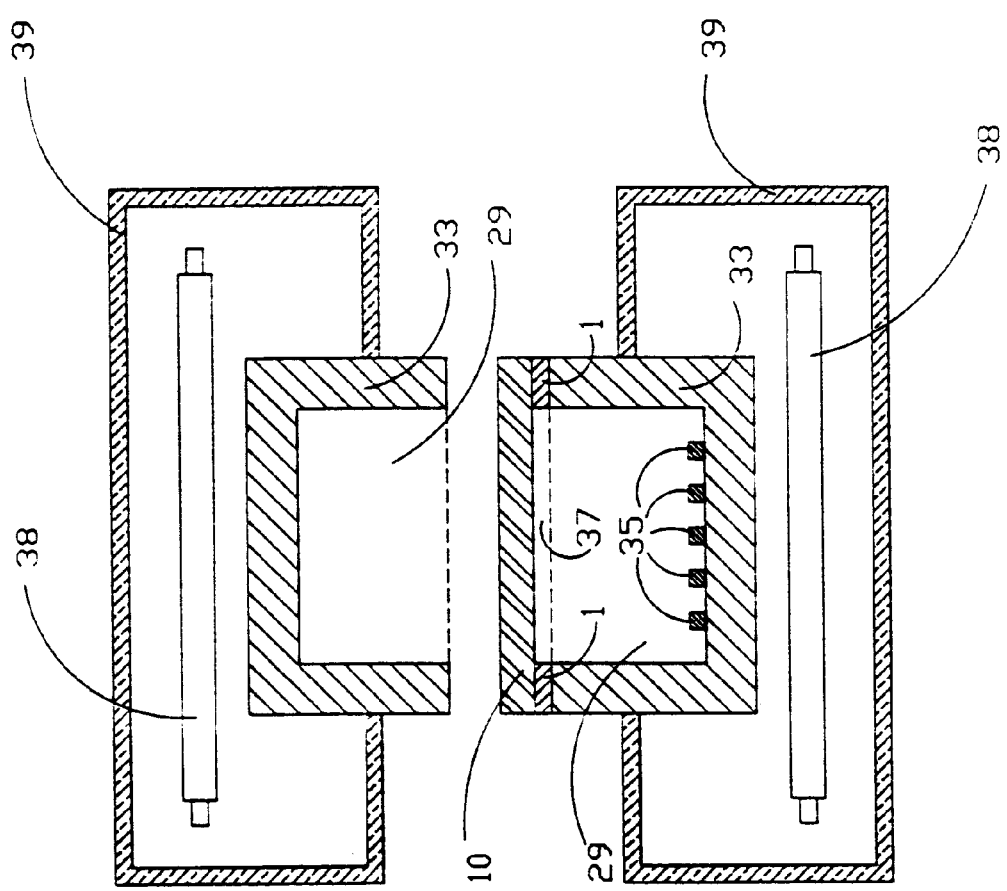
FIG. 7A is a schematic elevation view in cross section along the line 80—80 in FIG. 2A, illustrating details of a vacuum process station of the substrate transport apparatus of FIG. 2A.

Each of the process stations 200 of FIG. 2A contain a pair of heated pockets 33. These heated pockets 33 provide a flux of heat or vapor and are suitably shaped blocks of a material with a high thermal conductivity. In FIG. 7A the pair of heated pockets 33 are shown with details of the pair of continuous metal strip belts 1 in cross section. Both upper and lower heated pockets 33 have a machined pocket 29. A deposition material 35 is shown in the pocket 29 of the lower heated pocket 33. Only the substrate 10 spans the pocket 29. No part of the belts 1 crosses the pocket 29, thus avoiding deposition anywhere but on the substrate 10. The upper heated pocket 33 serves as a heater for the substrate 10.

Heated pocket 33 may be fabricated using any material which has an acceptable level of thermal conductivity. Further, that material should have a low level of porosity to prevent adsorption of air and water vapor and a low level of impurities. One material which has proven useful is purified pyrolitic grade graphite. However, metals and metals coated with ceramics, as well as other suitable materials, may be chosen.

In the preferred embodiment of the invention, the heated pockets 33 are heated by a plurality of quartz halogen lamps 38, which are not damaged when used in vacuum at high temperatures. The temperature control of the heated pocket 33 may be accomplished by placing a thermocouple in the wall of the heated pocket 33 and using well known proportional with integral and derivative (PID) temperature control of the power to the lamps 38. Lamps 38 are contained in boxes 39 for protection. Boxes 39 also serve as support structure for the lamps 38 and the heated pocket 33. The boxes 39 also provide electrical isolation for safety, prevent arcing from the lamps 38, and also serve as radiation shields to reduce the loss of energy. Other means of heating the heated pocket 33, including resistive heating and inductive heating, for example, may be used as well.

Each of the process stations 200 may perform a variety of processes on a substrate 10. These processes include: i) rapidly heating a substrate, ii) annealing a substrate and films, iii) thermally stripping a film from a substrate, iv) exposing a substrate and films to a vapor treatment, or v) depositing a thin film on a substrate. The chosen processes performed by station 200 depend on three parameters: a) the temperature of the lower heated pocket 33, b) the temperature of the upper heated pocket 33, and c) the presence or absence of the deposition material 35. For processes i) through iii) described above, no deposition material 35 is loaded into the pocket 29. For process i) the upper and lower heated pockets 33 are maintained at temperatures such that the rapid heating of glass substrates 10 may be done in a short cycle time, on the order of one minute. The uniformity of heating prevents cracking of the substrates 10. For process ii), the upper and lower heated pocket 33 and substrate 10 are maintained at a temperature which will not resublime thin films off of the substrate 10. For process iii) the upper and lower heated pocket 33 and substrate 10 are maintained at a temperature that is high enough to cause films on the substrate 10 to sublime away.

For processes iv) and v) described above, deposition material 35 is loaded into the pocket 29. For process iv), the upper heated pocket 33 and substrate 10 are maintained at a higher temperature than the lower heated pocket 33. In this manner, the deposition material 35 will sublime in the pocket 29 of the lower heated pocket 33 and expose the lower surface of the substrate 10 to vapor, but the vapor will not be deposited as a film on the substrate 10. For process v), the lower heated pocket 33 is maintained at a relatively higher temperature than the substrate 10 and the upper heated pocket 33. In this manner, the deposition material 35 will sub in the pocket 29 of the lower heated pocket 33, and the vapor will condense and be deposited as a film on the lower surface of the substrate 10. All of these processes are robust, may be performed at high throughput, are occupationally and environmentally safe, and involve low capital cost.

In accordance with the present invention, the pair of metal belts 1 transports the substrates 10 through the plurality of process stations 200 or 300. The metal belts 1 and the substrates 10 may be moved continuously. However, the preferred embodiment of the present invention provides for intermittent motion of the metal belt 1 and the substrates 10. This motion is accomplished using a conventional stepper motor 7 and a stepper motor motion controller 8. The substrates 10 are placed at equal pitch distances on the belts 1, and the process stations 200 or 300 are placed one pitch distance apart. The intermittent motion consists of pauses in the motion of the belts 1 for processing and brief periods of motion of the belts 1 to advance the plurality of substrates 10 through the series of process steps. In this manner, an individual substrate 10 will pause at each process station 200 or 300 for an equal amount of time. A usefully period of time, hereinafter defined as the cycle time, consists of the total period of time for one pause and one movement of the belts 1. One substrate 10 will complete the series of inline vacuum process steps for each period of cycle time.

Since the process stations 200 or 300 are modular, a plurality of one type of process may be placed in series. If a given process step requires a processing time which exceeds the cycle time, then the given process step may be carried out over a series of similar processing stations 200 or 300. For example, an annealing step, which requires a longer period of time to complete than the cycle time, may be carried out over a series of annealing process stations 200.

The deposition of thin films onto substrates 10 is a critical processing step of the present invention. A detailed description of the deposition apparatus is given below.

The intermittent motion of the belts 1 allows a pause for deposition During the pause, as shown in FIG. 2A, the individual substrates 10, which are spaced at regular pitch intervals on the metal strip belts 1, will be in a sealing relationship with individual heated pockets 33. During this pause, the individual heated pockets 33 will deposit a film onto the substrates 10. For a given pause time, the thickness of the films can be varied by varying the temperature of each individual heated pocket 33. Closed loop control of film thickness may be achieved by measuring film thickness with known thickness monitors and adjusting the heated pocket 33 temperature as needed. Very precise control may be achieved since the deposition rate is a function of the temperature of the heated pocket 33.

The present invention is specifically designed to produce very uniform film deposition across the surface of the substrate 10 at high throughput so that in a mass manufacturing environment the reproducibility of the film uniformity from one substrate 10 to another substrate 10 is tightly controlled over long periods of time. In order to accomplish this desired aspect of the present invention, the substrate 10 is held in a novel sealing relationship with the pocket 29.

Figure 6A:
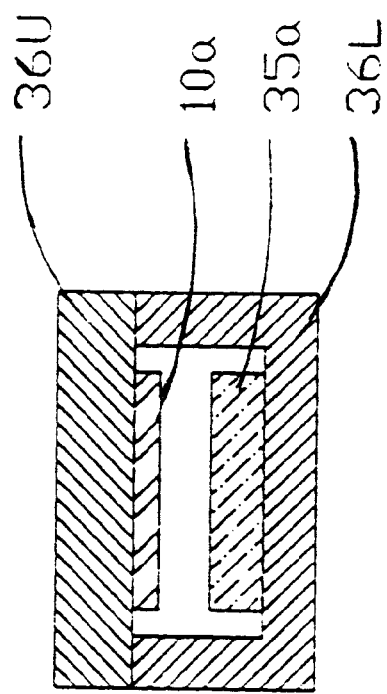
FIGS. 6A–B are schematic sectional elevation views illustrating enclosed and unenclosed substrates as they are positioned in prior art apparatuses.
Figure 6B:
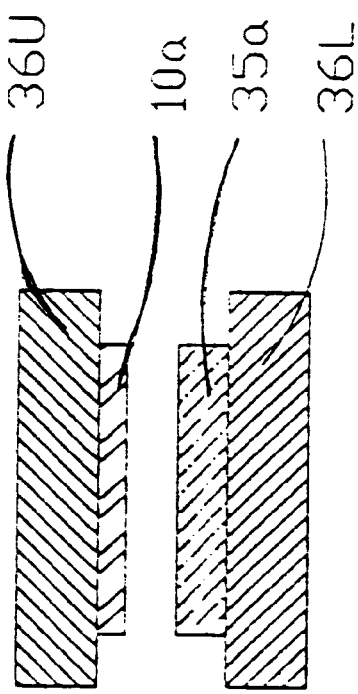

The novel sealing relationship is unique and is not shown or suggested in the prior art. FIG. 6A and FIG. 6B show an elevation view of two prior art devices used for film deposition by vacuum sublimation. In FIG. 6A, the known method of Bozler in U.S. Pat. No. 3,636,919 (1972) shows the source deposition material 35a and substrate 10a in an enclosed space. The enclosed space is formed by an upper heater 36 U and a lower heater 36 L. Because the substrate 10a is sealed in the enclosed space, the substrate 10a could not be moved and only one film could be deposited for each pump down of the vacuum chamber. FIG. 6B details another known method according to Bonnet in U.S. Pat. No. 5,304, 499 (1994) which is commonly known as close spaced sublimation (CSS). In this known method, the deposition material 35a is placed on a flat heated plate 36 L and the substrate is held at a typical distance of 2 to 3 mm from the deposition material 35a. The disadvantage of this known method is that the clearance between the deposition material 35a and the substrate 10a forms a leak path for the vapor. This leak will lead to non-uniform deposition and the formation of toxic nano particles in the process space.

The heated pocket deposition apparatus of the present invention overcomes the limitations of the prior art. With reference to FIG. 7A, there is a clearance distance 37 on the order of 0.001 in. to 0.018 in between the substrate 10 and the top surface of the heated pocket 33 block. Clearance distance 37 is formed on the two sides of the substrate 10 where the substrate 10 spans the belts 1. The clearance distance 37 is necessary to prevent the substrates 10 from touching the heated pocket 33 and damaging the deposited films. The clearance distance 37 is formed in such a manner as to provide a close tolerance slip fit seal between the top of the heated pocket 33 and the bottom of each of the substrates 10. Any vapor leak through the clearance distance 37 will be in the molecular flow regime and will be very small. This effectively eliminates vapor leaks through the clearance distance 37 and allows the substrates 10 to act as a shutter across the source pocket 29.

Furthermore, the walls of the pocket 29 will collimate the vapor flux from the subliming material 35. Since the clearance distance 37 is at the top of the pocket 29 and at a right angle to the collimated vapor flux, nearly all of the vapor flux will pass the entry of the clearance distance 37 without directly entering it. Any vapor which does enter the clearance distance 37 due to gas scattering will be readily deposited on the surface of the substrate 10. The design of the clearance distance 37 allows for movement of multiple substrates 10 while maintaining a vapor seal. This design has advantages over the prior art since it will maintain the deposition uniformity across the substrate 10. In the present invention, the use of the substrates 10 to act as a shutter virtually eliminates cross contamination between heated pockets 33. The elimination of cross contamination allows the use of one vacuum boundary for the multiple processing steps and reduces the capital cost of the system In most vacuum processes for processing PV devices, load locks or load locks in combination with intermediate chambers are used to prevent cross contamination between processing steps.

As shown in FIG. 7A, the deposition material 35 must be distributed in an evenly spaced pattern across the floor of the pocket 29. The deposition material 35 may be in the form of powder, pellets pressed from powder, or random chunks. All of these forms of material for the fabrication of CdTe PV are commercially available. Also, the distance between the deposition material 35 and the lower surface of the substrate 10, which is provided by the depth of the pocket 29 in the lower heated pocket 33, must be sufficient to allow for gas scattering of the sublimed species.

Gas scattering is the result of collisions among the sublimed species or between the sublimed species and the molecules of the ambient background gas. These collisions deflect and scatter the sublimed species from following a straight line path from the deposition material 35 to the substrate 10. This scattering of the sublimed species results in a uniform deposition on the substrate 10 The Knudsen number is a known dimensionless parameter which is used to quantify the amount of gas scattering present. The Knudsen number is the ratio of the mean free path in the pocket 29, at a given temperature and pressure, divided by the distance between the deposition material 35 and the substrate 10. If the Knudsen number is less than 0.01, then the species within the pocket 29 are in viscous flow and gas scattering will be significant In this viscous flow regime, the gas scattering may lead to such a loss of energy from the sublimed species that they condense to form nano-particles. For Knudsen numbers greater than 1, the species will be in a molecular flow regime with very little gas scattering. In this molecular flow regime, the sublime species will travel in straight lines to the substrate. This line of sight deposition causes non-uniform film thickness across the substrate 10. For Knudsen numbers between 0.01 and 1, the species will be in transition flow with some gas scattering. In the transition regime, the vapor flux is randomized by gas scattering. However, the number of collisions are few enough that the sublimed species retain most of their energy and therefore do not condense into nano-particles before striking the substrate 10. In the present invention, deposition has been done with Knudsen numbers in the transition regime from 0.07 to 0.44, which has led to uniform film thickness across the substrate 10.

An additional advantage of the present invention is the heating of the process gas in the pocket 29. Since the substrates 10 act as a shutter for the heated pocket 33, the process gas in the source pocket 29 comes to a uniform high temperature. The high temperature of the process gas in the heated pocket 33 is another factor which prevents the formation of nano-particles due to the gas scattering collisions described above.

The preferred embodiment of the present invention provides a means of forming a back electrode layer at high throughput and using equipment that is low capital cost. This layer is adherent to the other layers in the film stack and has a very low electrical resistively. As shown in FIG. 1, the back electrode is fabricated by a novel spray process at atmospheric pressure in process stations 52a and 52b. A layer of conductive graphite coating followed by a layer of conductive Ni coating are applied by known industrial spray methods to form the back electrode for carrying current. Sprays containing other metals besides Ni are known and may also be used. A metal conductive coating layer may also be applied by spray directly to the ohmic contact layer without an intervening carbon layer. In this description, carbon is not considered a metal To limit the inclusion of oxygen and water vapor into the metallization layer, the gas used as a propellant in the spray process may be a dry inert gas such as $N_2$ or Ar, and the process may be performed in a controlled environment.

The thick film of the back electrode contains a polymer binder, which provides a level of encapsulation and protection for the completed device. The spray is performed at room temperatures and does not harm or introduce defects into the previously fabricated semiconductor layers. The spray method has the advantage of low capital cost. Other known methods of metallization for PV devices, such as sputtering, require expensive high vacuum equipment.

The preferred embodiment of the present invention also provides a means of scribing that exhibits high throughput and low cost. As shown in FIG. 1, a scribing step may be performed at the film scribing station 53a after the graphite layer is formed by the spray process at the process station 52a. The scribing is performed after the application of the graphite layer to prevent any damage to the semiconductor layers by handling.

Figure 9A:
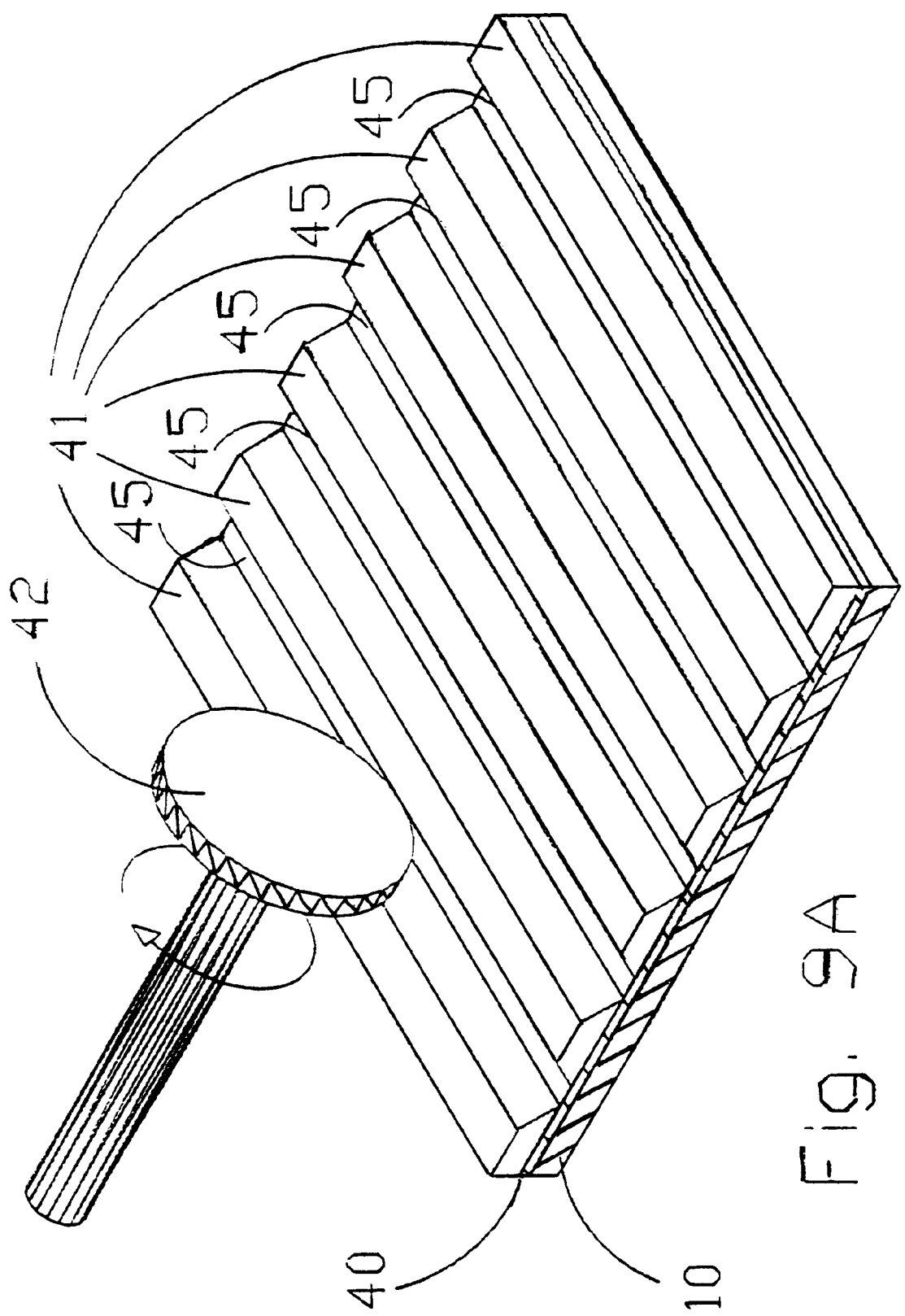
FIG. 9A is a schematic perspective view along the line 90—90 of FIG. 1, illustrating the way in which photovoltaic modules are scribed.

FIG. 9A illustrates the details of the preferred embodiment of the film scribing method. A rotating wire brush 42 is brought into contact through openings 45 in a mask 41 to remove portions of the film 40 from the substrate 10. The openings 45 in the mask 41 are tapered in cross section and are narrower near the contact of the mask 41 and the film layers 40. This facilitates the entry of the rotating brush 42 into the openings 45. The mask 41 may be coated with a hard coating, such as titanium nitride, to reduce wear.

The preferred embodiment of the film scribing method shown in FIG. 9A does not require a precisely defined rotating brush 42 since the openings 45 in the mask 41 define the area of the film 40 which will be removed. The rotating wire brush 42 is passed axially along the openings 45 in the mask 41 over the substrate 10 to perform a scribe. A plurality of rotating metal brushes 42 may also be provided so that one pass along the axis of the openings 45 in the mask 41 will complete the plurality of scribes on an entire substrate 10. This film scribing method has the ability to scribe layers selectively. By using an abrasive powder with the rotating brush 42, the TCO layer may be scribed. By using the rotating brush 42 alone, all of the layers except the TCO layer may be removed.

Figure 10A:
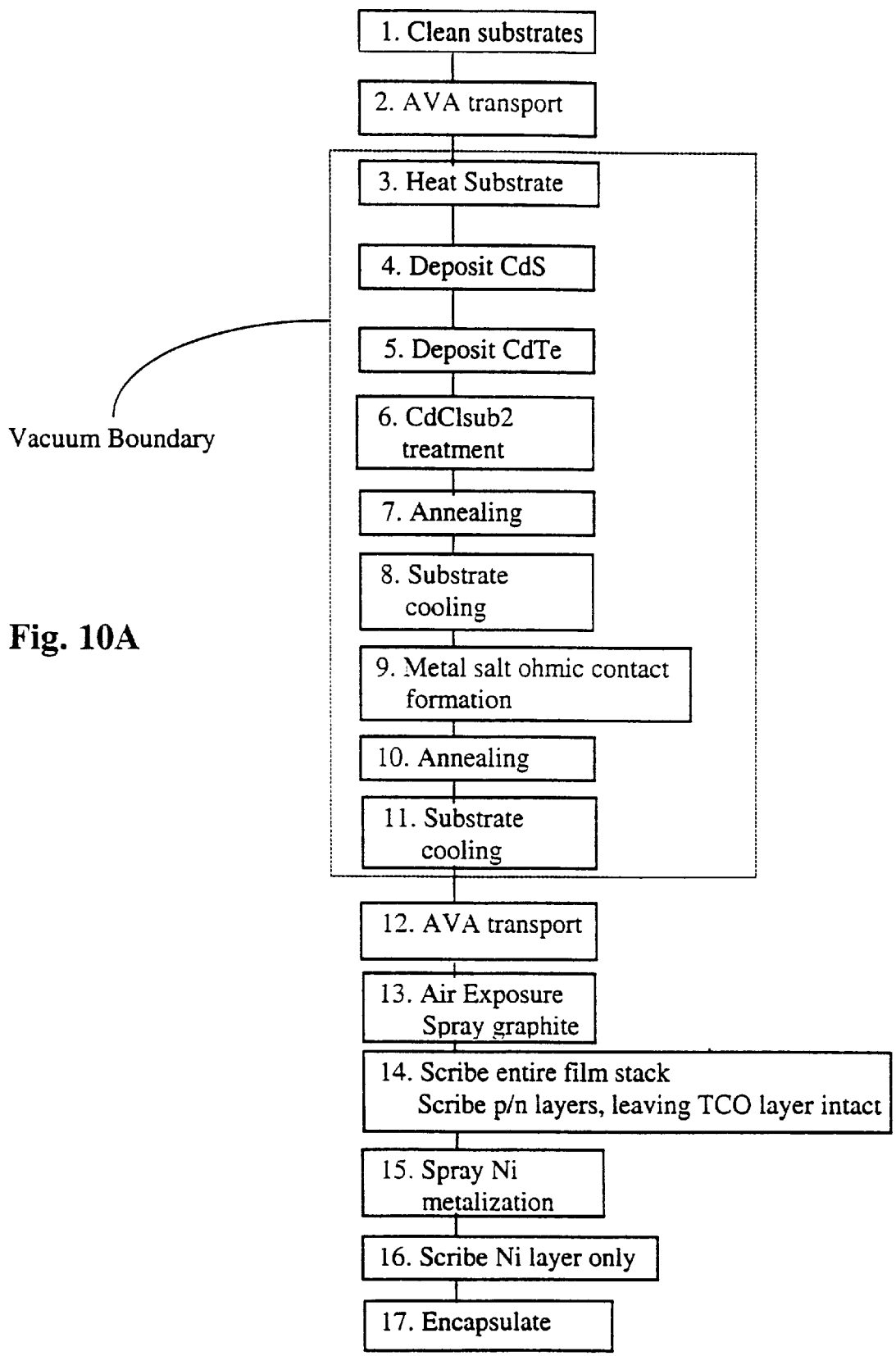
FIG. 10A is a flow chart illustrating the process steps of the present invention.

The process steps of the preferred embodiment of the present invention are shown in the flow chart of FIG. 10A. The overall system 1000 required to perform the process is shown in FIG. 1. The apparatus required to perform the vacuum portion of the process, from step 2) of FIG. 10A through step 12) of FIG. 10A, is illustrated in FIG. 2A. With reference to FIG. 2A, the substrates 10 are transported through the vacuum process stations 200 and 300 on the metal strip belts 1. As shown in FIG. 10A, these process steps may be performed by a single one or a series of the vacuum process stations 200 or 300 illustrated in FIG. 2A. The total time required for processing at each process station 200 or 300 and the transport of the substrate 10 to the next process station 200 or 300 is a unit of cycle time as defined above. The cycle time in the process description below is in the range of 30 seconds to 2 minutes.

With reference to FIG. 10A, a description of the process steps performed on each individual substrate 10 as the plurality of substrates 10 pass through the process is given below.

In step (1) the substrate 10, which may have a TCO layer on one surface, is ultrasonically cleaned, rinsed, dipped in isopropyl alcohol to remove water from the surface, and dried in a clean room type mini-environment.

In step (2) the substrate 10 is transported into the vacuum chamber 3 through the AVA opening 2 using the metal strip belts 1.

In step (3) the substrate 10 is heated to a temperature in the range of 500° C. to 560° C. and transported to the next process.

In step (4) with the temperature of the substrate 10 in the range of 500° C. to 560° C., a CdS film is deposited onto the TCO layer on the substrate 10 and the substrate 10 is transported to the next process.

In step (5) with the temperature of the substrate 10 in the range of 500° C. to 560° C., a CdTe film is deposited onto the CdS layer on the substrate 10 and the substrate 10 is transported to the next process.

In step (6) and step (7) a $CdCl_2$ treatment is performed on the CdS/CdTe layers. In step (6) with the temperature of the substrate 10 in the range of 300° C. to 500° C., the CdS/CdTe layers on the substrate 10 are exposed to $CdCl_2$ and the substrate 10 is transported to the next process. The $CdCl_2$ exposure of the CdS/CdTe layers on the substrate 10 may be to a $CdCl_2$ vapor or a $CdCl_2$ film may be deposited on the CdTe layer. Either method of CdCl exposure will produce high efficiency CdTe PV devices. For this process step, a series of $CdCl_2$ treatment stations may be required.

In step (7) with the temperature of the substrate 10 in the range of 400° C. to 450° C., the $CdCl_2$ treated layers on the substrate 10 are annealed, any $CdCl_2$ film is removed, and the substrate 10 is transported to the next process. For this process step, a series of annealing stations may be required. In combination, step (6) and step (7) provide the $CdCl_2$ treatment of the CdS/CdTe layers. The $CdCl_2$ treatment of CdTe PV devices in vacuum is known. However, no prior art shows the $CdCl_2$ treatment step performed inline between the deposition of the CdTe layer and the formation of the ohmic contact layer and without the substrate leaving vacuum Also, no prior art shows directly transporting substrates from CdTe deposition to $CdCl_2$ treatment.

In step (8) the substrate 10 and films are cooled to the required temperature in the range of 250° C. to 100°0 C. and the substrate 10 is transported to the next process. For this process step, a series of cooling stations may be required.

In step (9) and step (10) an ohmic low resistance contact is formed on the CdTe layer. in step (9) with the substrate 10 temperature in a range of 150° C. to 300° C., a metal salt is deposited onto the CdTe layer on the substrate 10, and the substrate 10 is transported to the next process. One metal salt which has been used for this process step is CuCl. In step (10) with the temperature of the substrate 10 in a range of 150° C. to 250° C., the CdS/CdTe/metal salt layers on the substrate 10 are annealed, and the substrate 10 is transported to the next process. For this process step a series of annealing stations may be required. In combination, step (9) and step (10) produce a reaction between the metal salt and the surface of the CdTe layer and this reaction produces a thin p+ semiconductor layer on the CdTe surface to form the ohmic contact. In the case of a Cu salt, a copper telluride such as $CuTe_x$ or Cu doped CdTe:Cu or both may be formed. The thin p+ layer provides a low resistance ohmic contact on the surface of the CdTe layer and is stable. The prior art does not show the formation of an ohmic contact layer on CdTe by deposition of a metal salt onto the CdTe layer in vacuum.

In step (11) the substrate 10 and films are cooled to the required temperature in the range of 25° C. to 100° C. and the substrate 10 is transported to the next process. For this process step, a series of cooling stations may be required.

In step (12) the substrate 10 is transported out of the vacuum chamber 3 through the AVA opening 2 on the metal strip belts 1.

In step (13) the ohmic contact layer is exposed to air for an optimum time in the range of 4 to 16 hours before a layer of conductive coating containing carbon is applied onto the ohmic contact layer by a spray process. The air exposure has led to PV devices with increased long term stability.

As described in the prior art, a series of scribes in selected film layers on the substrate 10 are required to isolate individual PV cells on the substrate and to interconnect the individual cells on the substrate 10 to form a completed module.

In step (14) a plurality of first scribes through the all of the film layers on the substrate 10 including the transparent conductive oxide are performed. A second plurality of scribes through the carbon and the p/n layers without removing the TCO are performed parallel to the first set of scribes. Both of these sets of scribes are performed by the novel film scribing method described above with reference to FIG. 9A.

In step (15) a layer of conductive coating containing Ni is applied by spray onto the layer of conductive coating containing carbon. Since the Ni metalization layer is formed after the second set of scribes, the Ni layer will fill the cuts in the semiconductor layers from the second scribe. This will cause an electrical connection of the back electrode of one cell to the front electrode of another cell. This step in combination with the following step of the final scribe of the metalization layer will complete the interconnection of the PV cells in series to form the PV module.

In step (16) a plurality of third scribes through only the metallization layers are performed. This third set of scribes is performed by the novel film scribing method described above with reference to FIG. 9A.

In step (17) electrical connections are made and the finished module is encapsulated.

In any of the film deposition steps, including the steps 4), 5), 6), or 9) of FIG. 10A, more than one layer of a particular material may be deposited. These multiple layers may be deposited by a series of heated pocket deposition apparatuses. If one layer of material is deposited in a given cycle time, to a given thickness, then this single layer may be replaced by many thinner layers built up to the thickness of the single layer of material by using many depositions at shorter cycle times. Multiple depositions are advantageous since for every decrease in cycle time there is a corresponding increase in production rate. Multiple processing stations can also be used to decrease the cycle time for the other steps including annealing, vapor treatment, cooling, etc.

It would also be possible to create a multijunction solar cell in accordance with the teachings of the present invention. In this case, a monolithic multijunction structure could be fabricated on the substrate. In this structure, two or more solar cells would be stacked on one substrate in such a way that solar radiation passes through the larger band gap material first, and residual radiation passes through the stack to a smaller band gap material. The band gap of the materials needed could be tailored by using semiconductors formed by the combination of any of the elements Zn, Cd, Hg, S, Se, or Te. These elements are from group IIB and group VIB of the periodic table. These semiconductors may be in the form of alloys containing three or more elements. The multiple layers may be deposited by a series of heated pocket deposition apparatuses. Also, by varying the composition of the deposition material in the multiple heated pockets, a graded band gap photovoltaic device may be fabricated.

Many devices were fabricated by following the process steps (1) through (13) and step (15) of FIG. 10A described above. CuCl was used as the metal salt in step (9). Individual PV devices with an area of 0.3 sq. cm. were formed on many substrates 10. These devices were defined by masking certain areas and removing the rest of the films on the substrates 10 with an abrasive blast. The best device had a conversion efficiency of 11.8% and was produced on a commercially available low cost $SnO_x$:F coated soda lime glass substrate 10. Such high efficiency devices have also proven to be stable. Accelerated stress testing by light soaking at 1000 W/m² and 65° C. at open circuit condition was performed on many devices. Over a time period of hundreds of hours, measured device efficiencies were at least 98% of the original efficiencies.

A description of the preferred embodiment of the present invention was given above. Other alternate embodiments of the present invention are described below. These specific alternate embodiments are best described with reference to FIG. 10A, which is a flow chart of the process steps of the preferred embodiment of the invention.

In alternate embodiments of step 9) in FIG. 10A, the deposition of the metal compound may include compounds of Cu, Ag, Au, Hg, Sn, Sb, and Pb. These compounds may be metal salts as described in the preferred embodiment or organometallic compounds of Cu, Ag, Au, Hg, Sn, Sb, and Pb may also be used. These compounds may be deposited onto CdTe in vacuum to form an ohmic low resistance contact layer by reaction with the CdTe layer. This ohmic low resistance contact may be formed by tellurides of Cu, Ag, Au, Hg, Sn, Sb, and Pb, or the ohmic contact may be highly doped CdTe. An alternative embodiment to step 10) of FIG. 10A is to anneal the ohmic contact layer in air, inert gas or other atmospheres outside the vacuum chamber.

In other embodiments of the process steps 4) and 5) of FIG. 10A other semiconductors may be used instead of CdS and CdTe. These semiconductors are formed by the combination of any of the elements Zn, Cd, Hg, S, Se or, Te. These elements are from group IIB and group VIB of the periodic table. These semiconductors may also be in the form of alloys containing three or more elements. These compound semiconductors are known to be useful in the formation of PV devices, are readily sublimable, and may be deposited in vacuum by the present invention. A series of stations may be used to deposit the n-type and p-type semiconductors. Thus, more than one layer may be used to form the n-type and p-type regions of the device This allows a faster cycle time while still maintaining adequate semiconductor film thickness. Also, the different stations may deposit different IIB–VIB compound semiconductors made up of the elements Zn, Cd, Hg, S, Se or, Te.

In alternate embodiments of step 6) of FIG. 10A, halogen containing substances such as HCl or $Cl_2$ gas may be used in place of or in addition to $CdCl_2$. In this case, a controlled amount of the gas can be introduced into the heated pocket 33. Other halogen containing substances which are known to have effects similar to $CdCl_2$ may also be used. Sore known examples of these compounds are $CdBr_2$ and $CdI_2$.

In another alternate embodiment of the process steps of FIGS. 10A, a CdTe PV device may be fabricated without the deposition of CdS shown in step 4) of FIG. 10A. In this embodiment, the p/n junction is formed between the n-type TCO and the p-type CdTe or other IIB–VIB compounds.

In another embodiment of the process steps of FIG. 10A, a CdTe device may be fabricated by depositing the CdS layer on the substrate 10 outside of the vacuum chamber 3 by known methods, including chemical bath deposition. In this embodiment, the substrate 10 with the CdS layer would be brought into the vacuum chamber 3 and steps 3) through step 11) of FIG. 10A would be performed in vacuum.

In another embodiment of the process steps of FIG. 10A, a $CdCl_2$ treatment may be performed after step 4) CdS deposition and before step 5) CdTe deposition. This $CdCl_2$ treatment is in addition to the step 6) $CdCl_2$ treatment as shown in FIG. 10A. The additional $CdCl_2$ treatment is known to further increase the device performance.

In other alternative embodiments of FIG. 10A, the HPD deposition heated pocket 33 may be used to apply other film layers which would improve the performance of a CdS/CdTe PV device. One such layer is an anti-reflection (AR) coating which would be deposited on the glass substrate 10 on the opposite side of the substrate 10 from the TCO. The AR coating would face the sun and reduce the amount of incoming sunlight which is reflected off of the glass surface. This would increase the current that the device could produce. One such AR coating is a thin film of $MgF_2$. Since $MgF_2$ is sublimable, this film may be applied with the heated pocket 33 deposition. The AR coating can be done at a suitable location in the vacuum chamber 3. Another layer which is known to increase the efficiency of a CdS/CdTe device is a layer of high resistively intrinsic tin oxide (i-SnO$_x$). This layer would be applied between the TCO layer and the CdS layer or a layer of SnO$_x$ of the desired resistively could be deposited directly on the glass substrate 10. This intrinsic layer has a much higher electrical resistively than the TCO layer and has been shown to increase device efficiency. This resistive layer would allow the CdS layer to be thinner. The thinner CdS layer would allow more light to pass into the CdTe layer and increase the current the device would produce. The heated pocket 33 could be used to sublime i-SnO$_x$. The i-SnO$_x$ deposition would be performed before the CdS deposition of step 4) of FIG. 10A.

An alternate embodiment to step 15) of FIG. 10A is that the graphite and Ni may be sprayed through a mask to form a patterned deposition. This patterned back electrode would eliminate the need for the second and third set of scribes shown in steps 14) and 16) of FIG. 10A. In another embodiment, a spray through a mask may also be used to fill the cut of the first scribe with an insulating compound before the spraying of the Ni conductive coating. The insulating compound eliminates electrical shunts between the Ni layer and the TCO.

Other alternate embodiments of the present invention are described below. The figures which show these alternative embodiments are FIGS. 2B, 7B, 8, 9B, and 10B. These alternative embodiments are described with reference to these figures.

Figure 2B:
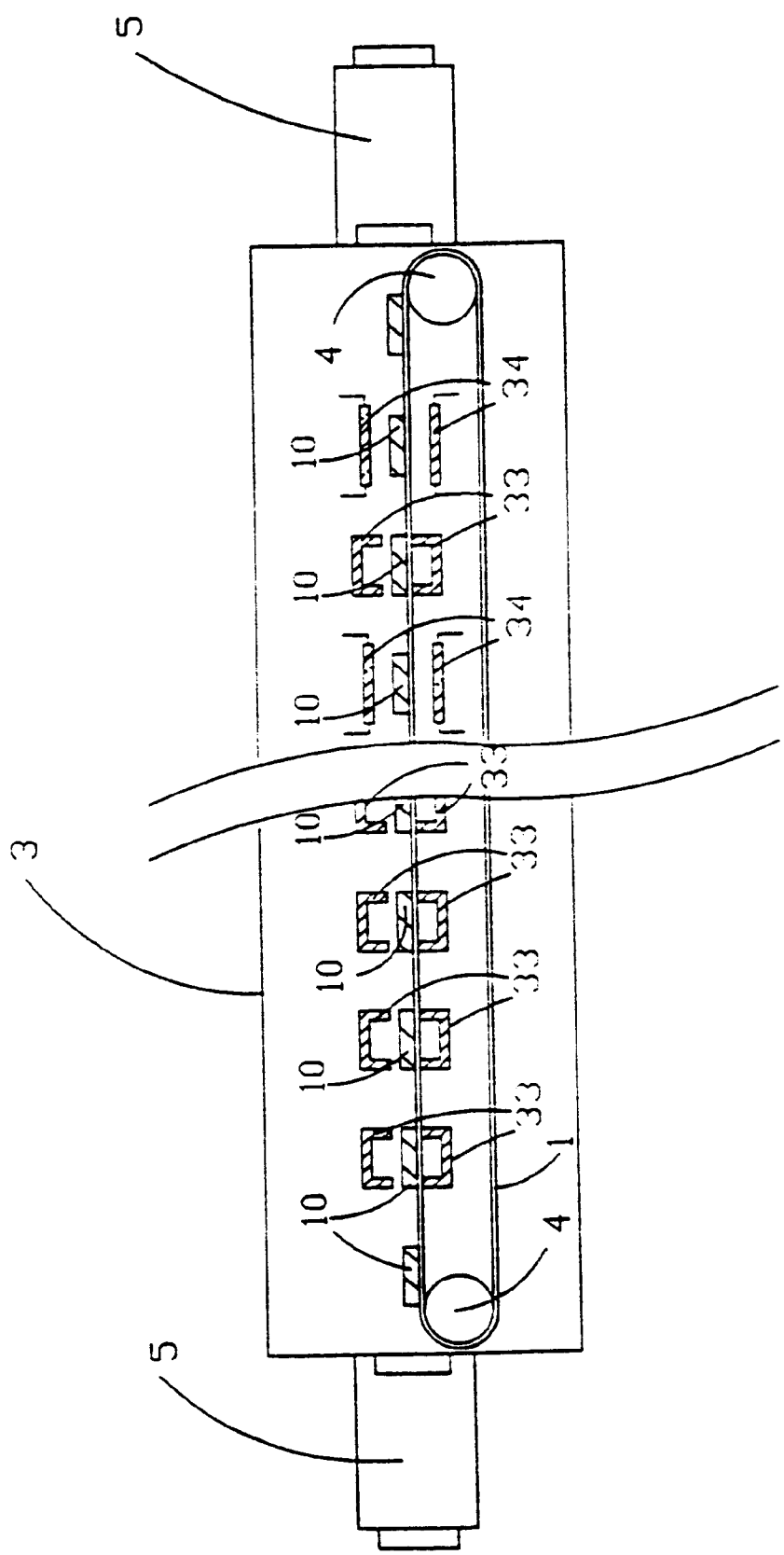
FIG. 2B is a partially broken away schematic elevation view in longitudinal section, illustrating an alternate embodiment of the substrate transport apparatus of FIG. 2A.
Figure 4:
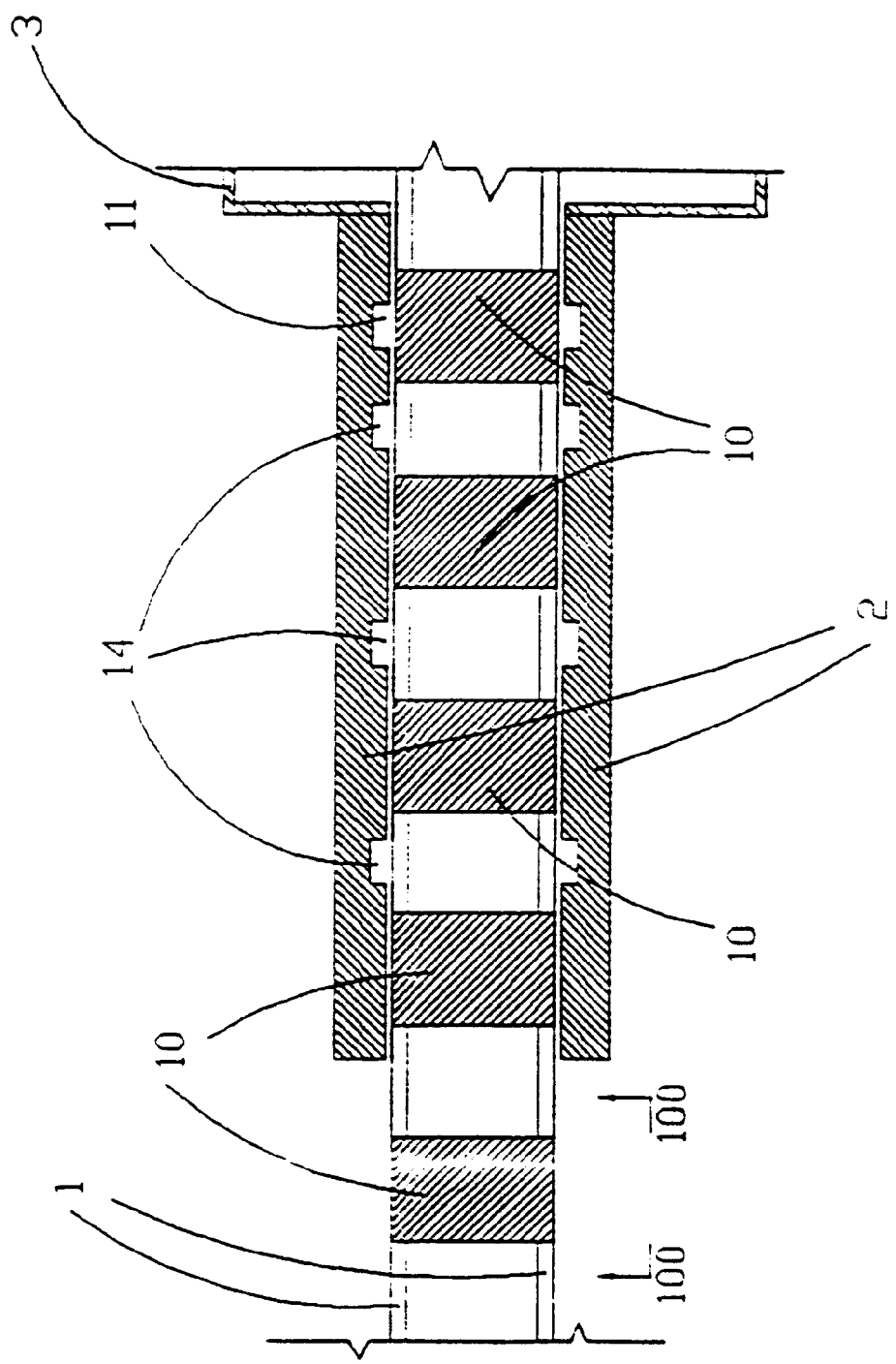
FIG. 4 is a partial schematic top plan view in longitudinal section along the line 70—70 of FIG. 2A, further illustrating the sealing arrangement of FIG. 3.
Figure 7B:
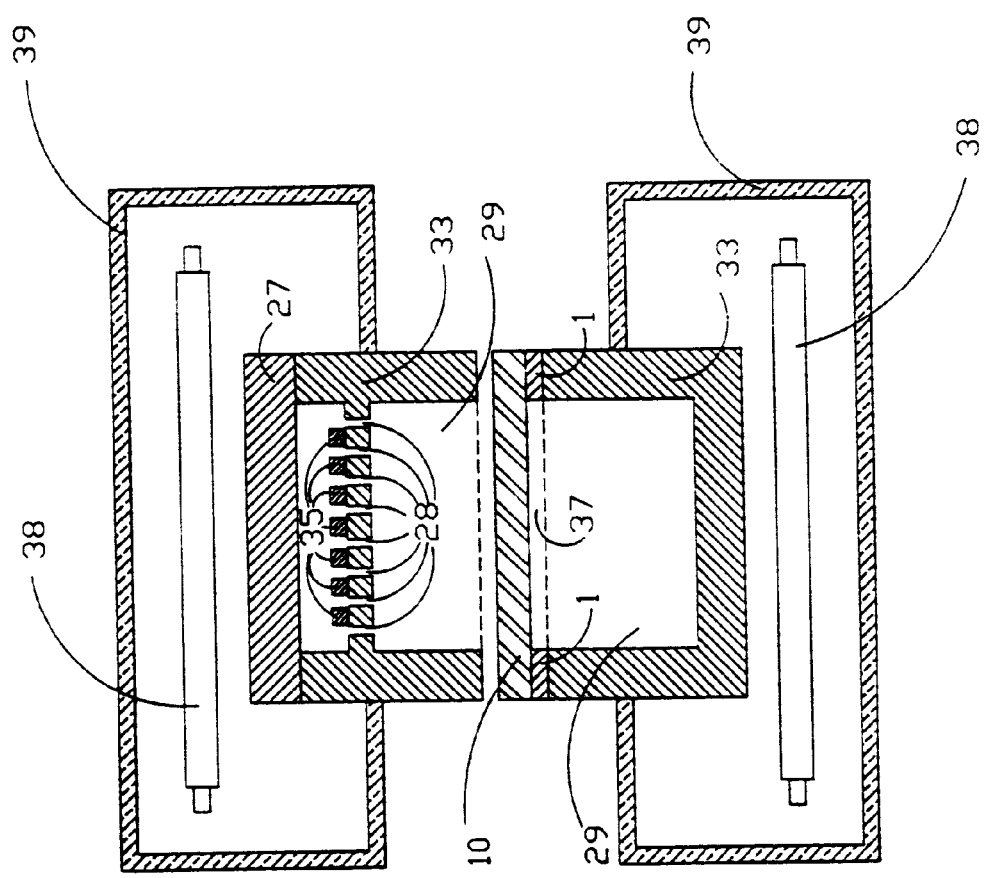
FIG. 7B is a schematic elevation view in cross section to illustrate an alternative embodiment of the vacuum process station of FIG. 7A.

FIG. 2B shows an alternate embodiment of the present invention in which the pair of continuous metal strip belts 1 are entirely contained within the vacuum chamber 3. A pair of known load locks 5 on either side of the chamber 3 provide a means of transporting the substrates 10 into and out of vacuum FIG. 7B illustrates an alternate embodiment of the vacuum process station of FIG. 7A involving a different arrangement for the upper heated pocket 33. This alternate embodiment involves the addition of a baffle having a plurality of holes 28. The deposition material 35 is placed above the baffle in a confined space. The confined space has a lid 27, which may be removed to reload the deposition material 35. As the upper heated pocket 33 is heated, the deposition material 35 will sublime, and vapor will pass through the holes 28 into the source pocket 29 of the upper heated pocket 33. This alternative embodiment of the vacuum process station 200 may be used as the heated pocket 33 to deposit films on the upper surface of the substrate 10. When the deposition is on the upper surface of the substrates 10, the substrates 10 can be transported by arrangements such as rollers, robotic arms, etc., which are well known. This would be especially useful for the deposition of the AR coating.

Figure 8:
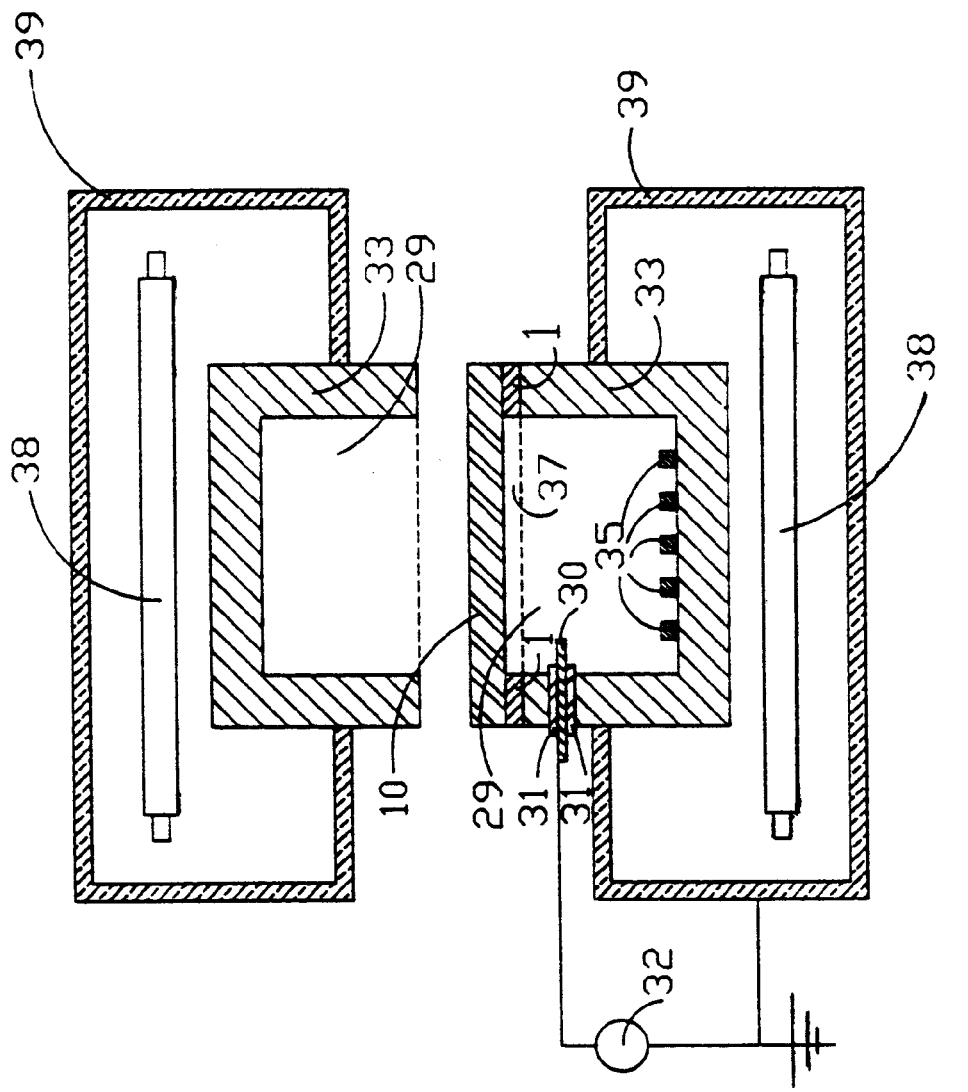
FIG. 8 is a schematic elevation view in cross section to illustrate a second alternate embodiment of the vacuum process station of FIG. 7A.

FIG. 8 illustrates an alternative to the heated pocket 33. This embodiment can be used to generate plasma in the pocket 29. This arrangement is called plasma enhanced heated pocket deposition (PEHPD). The alternate embodiment of the heated pocket 33 provides a high voltage pin 30 for the generation of plasma, the pin 30 may be made from graphite. The pin 30 is electrically isolated by insulation 31 which may be a quartz tube. The high voltage from the DC power supply 32 generates the plasma. The heated pocket-to-substrate distance in the PEHPD heated pocket must be large enough to produce ions within the pocket 29. If the pocket 29 is too shallow it will not produce a glow discharge at desirable pressures, when the substrate 10 is sealing the pocket 29 during deposition. In alternate embodiments of the present invention, both the CdS and CdTe heated pocket may optionally be of the PEHPD type so that the advantages of plasma enhanced deposition may be incorporated. These advantages of plasma enhanced deposition, which serve to improve the device efficiency, include: (i) doping of CdTe with nitrogen, (ii) passivation of the defects in CdTe, (iii) alteration of the morphology of CdS, (iv) doping of CdS, and (v) mixing of the CdS/CdTe interface. In addition, ZnTe may be doped with nitrogen by PEHPD to form ZnTe:N, a p+ semiconductor layer which may be used as an ohmic contact to CdTe.

Figure 10B:
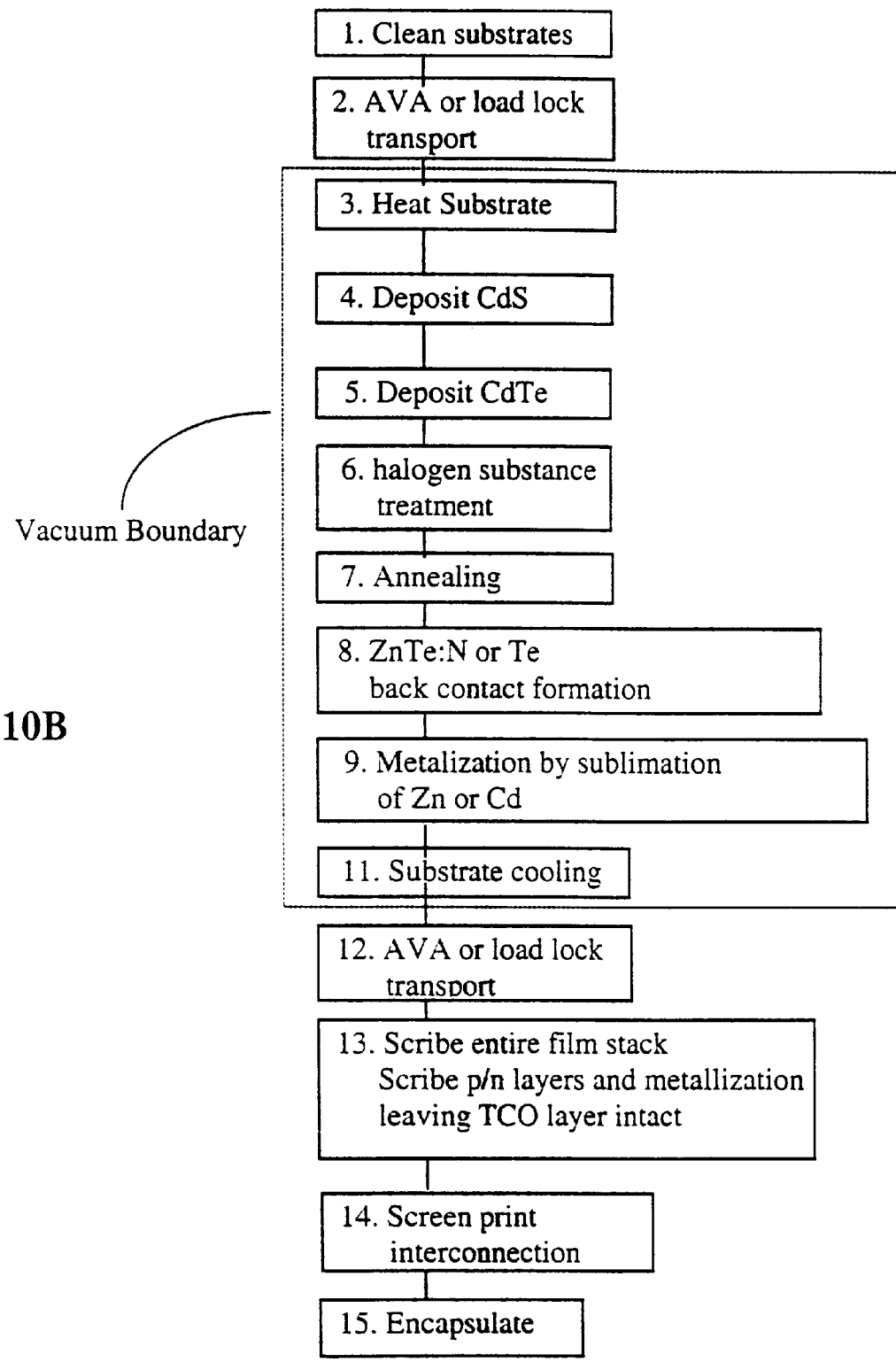
FIG. 10B is a flow chart of some of the alternate embodiments of the process steps of FIG. 10A.

FIG. 10B is a flow chart of the process steps of some of the alternate embodiments of the invention. The processing steps as shown schematically in that figure include (1) cleaning the substrate by known means in a clean room type mini-environment, (2) transporting the substrate into the vacuum chamber using AVA or load lock transport, (3) heating the substrate, ( 4) depositing a CdS film on the substrate using heated pockets with or without plasma, ( 5) depositing a CdTe film onto the CdS film using heated pockets with or without plasma, (6) performing a treatment, with a halogen containing substance, on the CdS/CdTe films using a heated pocket, (7) annealing the substrate and films, (8) forming an ohmic contact on the CdTe layer by heated pocket deposition of a Te layer on the CdTe layer or by heated pocket deposition with plasma of a ZnTe:N layer on the CdTe layer, (9) depositing a metallization layer onto the ohmic contact layer by heated pocket deposition of a sublimable metal layer such as Zn or Cd, (10) annealing the substrate and films, (11) cooling the substrate and films, (12) transporting the substrate and films from the vacuum chamber using AVA or load lock transport, (13) performing a first scribe through the entire film stack including the metallization and the transparent conductive oxide, (14) screen printing the electrical connection of the back electrode of one cell to the front electrode of the next cell by known screen printing methods, and (15) encapsulating the finished module. Step (13) involves a first scribe that may be performed in accordance with the teachings of the present invention or by one of several known means including mechanical or laser scribing and a second scribe through the carbon and the p/n layers without removing the TCO.

Step 8) in FIG. 10B illustrates another alternative embodiment of the present invention in which Te is used as an ohmic contact layer Te is easily sublimed and is known to form an ohmic contact material for CdTe devices. After the CdCl$_2$ treatment and annealing steps, Te could be deposited inline by heated pocket deposition with or without a cooling step. A metal back electrode can be applied to the Te ohmic contact by either a vacuum deposition step or by the spray process of the present invention.

Step 9) of FIG. 10B illustrates an alternate embodiment of the present invention in which the back electrode metallization may be accomplished inline in vacuum. In this embodiment, the back electrode metallization may be applied by a heated pocket deposition of metals including, but not limited to, Zn or Cd, which are readily sublimable and electrically conductive.

Figure 9B:
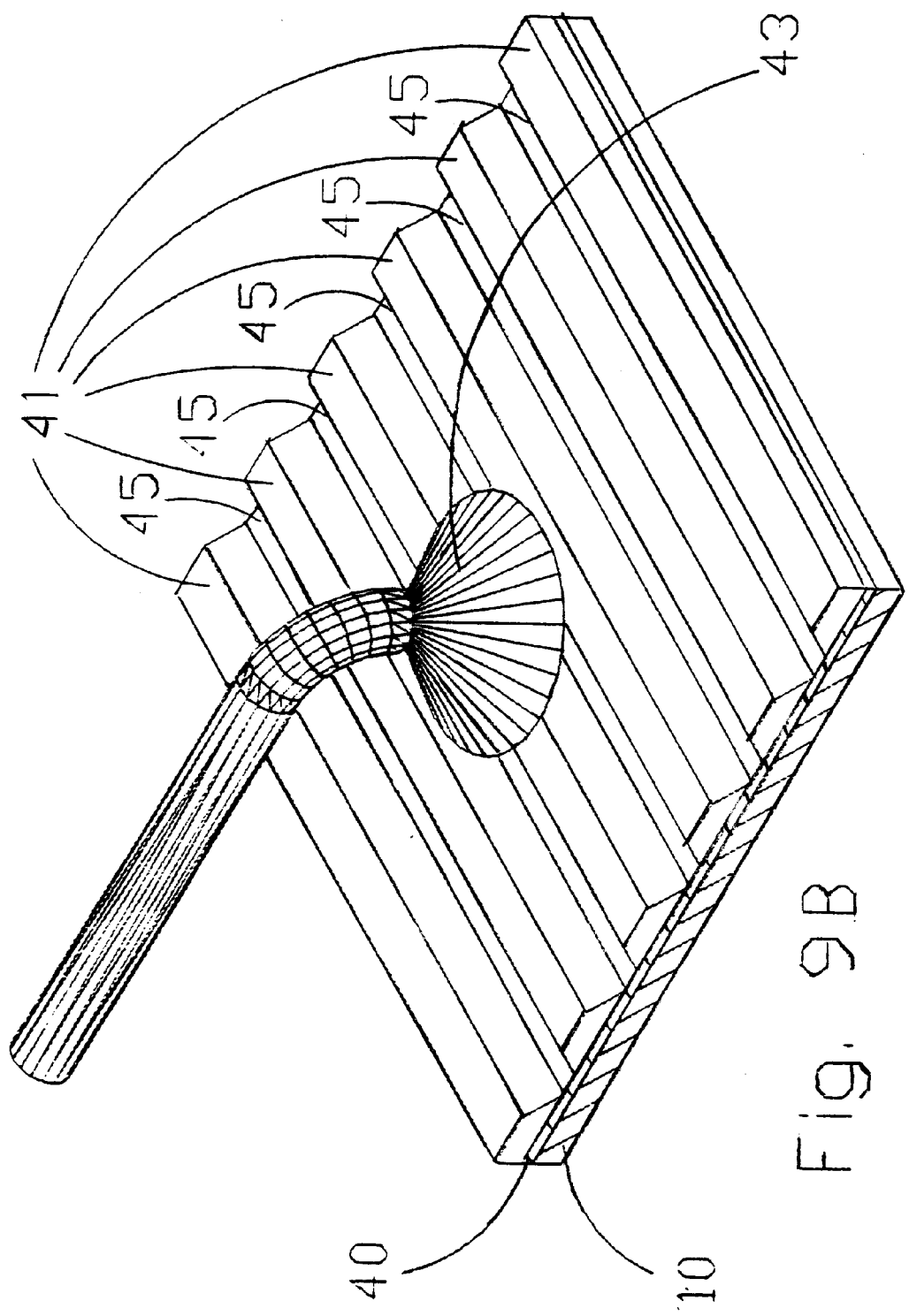
FIG. 9B is a schematic perspective view along the line 90—90 of FIG. 1, illustrating an alternative way to scribe photovoltaic modules.

FIG. 9B illustrates an alternative embodiment of the scribing method of the present invention involving the use of an abrasive blast 43 which is provided by known methods. The abrasive blast 43 is performed through openings 45 in the mask 41 to remove portions of the film 40 from the substrate 10. This embodiment of the scribing method does not require a precisely defined abrasive blast 43 since the mask 41 defines the area of the film 40 which will be removed. The abrasive blast 43 is passed over the substrate 10 to perform a scribe. Each abrasive blast 43 may enter more than one opening 45 in the mask 41 so that one abrasive blast 43 may perform more than one scribe for each pass over the substrate 10. A plurality of abrasive blasts 43 may be provided so that one pass along the axis of the openings 45 in the mask 41 will complete the plurality of scribes of an entire substrate 10. Different abrasive media with different hardness and size may be provided so that various layers in the film stack 40 may be scribed selectively. This allows the scribing method of the present invention to: 1) scribe all the way through the film stack including the relatively hard TCO layer, and 2) selectively scribe through all of the layers above the TCO layer without removing the TCO.

We claim:

1. A method for fabricating semiconductor layers of a photovoltaic cell, all of the steps of which are carried out in a single vacuum chamber at a constant vacuum level, the method comprising the steps of:

providing, in the vacuum chamber, a substrate upon which the photovoltaic cell is to be fabricated;

heating the substrate to a desired temperature in the vacuum chamber;

depositing one or more layers of n-type IIB/VIB semiconductor material onto a surface of the substrate in the vacuum chamber;

depositing one or more layers of p-type IIB/VIB semiconductor material onto the one or more layers of n-type IIB/VIB semiconductor material in the vacuum chamber;

treating the one or more layers of n-type IIB/VIB and p-type IIB/VIB semiconductor material with a halogen containing substance in the vacuum chamber; and forming an ohmic contact on the treated one or more layers of p-type IIB/VIB semiconductor material in the vacuum chamber by depositing a metal compound onto the treated one or more layers of p-type IIB/VIB semiconductor material and then annealing the treated one or more layers of p-type IIB/VIB semiconductor material.

2. A method as in claim 1, wherein the n-type semiconductor material comprises cadmium sulfide.

3. A method as in claim 1, wherein the p-type semiconductor material comprises cadmium telluride.

4. A method as in claim 1, wherein the halogen containing substance comprises cadmium chloride.

5. A method as in clam 1, further comprising the step of depositing in the vacuum chamber a layer of a transparent conductive oxide onto the substrate prior to the step of depositing the one or more layers of n-type IIB/VIB semiconductor onto the substrate .

6. A method as in claim 1, further comprising the step of depositing an anti-reflective layer on an opposite surface of the substrate in the vacuum chamber.

7. A method as in claim 1, further comprising the step of treating the one or more layers of n-type IIB/VIB semiconductor material with the halogen containing substance prior to depositing the one or more layers of p-type IIB/VIB semiconductor material.

8. A method as in claim 7, wherein the halogen containing substance comprises cadmium chloride.

9. A method a s in claim 7, wherein the step of treating the one or more layers of n-type IIB/VIB semiconductor material with the halogen containing substance comprises:

exposing the one or more layers of n-type IIB/VIB semiconductor material to the vapor of the halogen containing substance for a predetermined time at a specific temperature; and annealing the one or more layers of n-type IIB/VIB semiconductor material previously exposed to the-vapor of the halogen contain substance.

10. A method as in claim 9, wherein:

the temperature at which the one or more layers of n-type IIB/VIB semiconductor material is exposed to the vapor of the halogen containing substance is suitable for depositing a film of the halogen containing substance onto the one or more layers of n-type IIB/VIB semiconductor material; and the step of annealing the one or more layers of n-type IIB/VIB semiconductor material is performed at a temperature suitable for treating the one or more layers of n-type IIB/VIB semiconductor material and removing the previously deposited film of the halogen containing substance.

11. A method as in claim 1, wherein the step of treating the one or more layers of n-type IIB/VIB semiconductor material and p-type IIB/VIB semiconductor material with a halogen containing substance comprises:

exposing the one or more layers of n-type IIB/VIB semiconductor material and p-type IIB/VIB semiconductor material to the vapor of the halogen containing substance for a predetermined time at a specific temperature; and annealing the one or more layers of n-type IIB/VIB semiconductor material and p-type IIB/VIB semiconductor material that have been exposed to the vapor of the halogen containing substance.

12. A method as in claim 1, wherein:

the temperature at which the one or more layers of n-type IIB/VIB semiconductor material and p-type IIB/VIB semiconductor material are exposed to the vapor of the halogen containing substance is suitable for depositing a film of the halogen containing substance onto the one or more layers of p-type IIB/VIB semiconductor material; and the step of annealing the one or more layers of n-type IIB/VIB semiconductor material and p-type IIB/VIB semiconductor material is performed at a temperature suitable for treating the one or more layers of n-type IIB/VIB semiconductor material and p-type IIB/VIB semiconductor material and removing the previously deposited film of the halogen containing substance.

13. A method as in claim 1, wherein the metal compound is a metal salt selected from the group comprising the salts of copper, silver, gold, tin, lead, antimony, and mercury.

14. A method as in claim 1, wherein the metal compound is an organometallic compound selected from the group comprising the organometallic compounds of copper, silver, gold, tin, lead, antimony, and mercury.

15. A method for forming an ohmic contact on one or more layers of p-type IIB/VIB semiconductor material, the method comprising the steps of:

depositing a metal compound onto the one or more layers of p-type IIB/VIB semiconductor material in the vacuum chamber; and annealing the one or more layers of p-type IIB/VIB semiconductor material in the vacuum chamber.

16. A method as in claim 15, wherein the step of annealing the one or more layers of p-type IIB/VIB semiconductor material in the vacuum chamber comprises heating said one or more layers of p-type IIB/VIB semiconductor material in a suitable gas.

17. A method as in claim 15, wherein the one or more layers of p-type IIB/VIB semiconductor material comprises cadmium telluride.

18. A method as in claim 15, wherein the metal compound is a metal salt selected from the group comprising the salts of copper, silver, gold, tin, lead, antimony, and mercury.

19. A method as in claim 15, wherein the metal compound is an organometallic compound selected from the group comprising the organometallic compounds of copper, silver, gold, tin, lead, antimony, and mercury.

20. A method for fabricating semiconductor layers of a photovoltaic cell all of the steps of which are carried out in a single vacuum chamber at a constant vacuum level, the method comprising the steps of:
    providing, in the vacuum chamber, a substrate having one or more layers of an n-type transparent conductive oxide upon which the photovoltaic cell is to be fabricated;
    heating the substrate to a desired temperature in the vacuum chamber;
    depositing one or more layers of p-type IIB/VIB semiconductor material onto a surface of the substrate in the vacuum chamber;
    treating the one or more layers of n-type transparent conductive oxide and p-type IIB/VIB semiconductor material with a halogen containing substance in the vacuum chamber; and
    forming an ohmic contact on the treated one or more layers of p-type IIB/VIB semiconductor material in the vacuum chamber.

21. A method as in claim 20, wherein the p-type IIB/VIB semiconductor material comprises cadmium telluride.

22. A method as in claim 20, wherein the halogen containing substance comprises cadmium chloride.

23. A method as in claim 20, wherein the step of treating the one or more layers of n-type transparent conductive oxide and p-type IIB/VIB semiconductor material with a halogen containing substance comprises:
    exposing the one or more layers of n-type transparent conductive oxide and p-type IIB/VIB semiconductor material to the vapor of the halogen contain substance for a predetermined time at a specific temperature; and
    annealing the one or more layers of n-type transparent conductive oxide and p-type IIB/VIB semiconductor material that have been previously exposed to the vapor of the halogen containing substance.

24. A method as in claim 23, wherein:
    the temperature at which the one or more layers of n-type transparent conductive oxide and p-type IIB/VIB semiconductor material are exposed to the vapor of the halogen containing substance is suitable for depositing a film of the halogen containing substance onto the one or more layers of p-type IIB/VIB semiconductor material; and
    the step of annealing the one or more layers of n-type transparent conductive oxide and p-type IIB/VIB semiconductor material is performed at a temperature suitable for treating the one or more layers of n-type transparent conductive oxide and p-type IIB/VIB semiconductor material and removing the film of the previously deposited halogen containing substance.

25. A method as in claim 20, wherein the step of forming an ohmic contact on the treated one or more layers of p-type IIB/VIB semiconductor material comprises depositing a metal compound onto the treated one or more layers of p-type semiconductor material and then annealing the treated one or more layers of p-type IIB/VIB semiconductor material.

26. A method as in 25, wherein the metal compound is a metal salt selected from the group comprising the salts of copper, silver, gold, tin, lead, antimony and mercury.

27. A method as in claim 25, wherein the metal compound is an organometallic compound selected from the group comprising the organometallic compounds of copper, silver, gold, tin, lead, antimony, and mercury.

28. A method as in claim 20, further comprising the step of depositing an anti-reflective layer on an opposite surface of the substrate in the vacuum chamber.

29. A method for fabricating semiconductor layers of a photovoltaic cell all of the steps of which are carried out in a single vacuum chamber at a constant vacuum level, the method comprising the steps of:
    providing, in the vacuum chamber, a substrate upon which the photovoltaic cell is to be fabricated, the substrate having one or more layers of n-type transparent conductive oxide thereon and one or more layers of n-type IIB/VIB semiconductor material on top of the one or more layers of n-type transparent conductive oxide;
    heating the substrate to a desired temperature in the vacuum chamber;
    depositing one or more layers of p-type IIB/VIB semiconductor material onto a surface of the substrate in the vacuum chamber;
    treating the one or more layers of n-type IIB/VIB semiconductor material and p-type IIB/VIB semiconductor material with a halogen containing substance in the vacuum chamber; and
    forming an ohmic contact on the treated one or more layers of p-type IIB/VIB semiconductor material in the vacuum chamber.

30. A method as in claim 29, wherein the n-type IIB/VIB semiconductor material comprises cadmium sulfide.

31. A method as in claim 29, wherein the p-type IIB/VIB semiconductor material comprises cadmium telluride.

32. A method as in claim 29, wherein the halogen containing substance comprises cadmium chloride.

33. A method as in claim 29, wherein the step of treating the one or more layers of n-type IIB/VIB semiconductor material and p-type IIB/VIB semiconductor material with a halogen containing substance comprises:
    exposing the one or more layers of n-type IIB/VIB semiconductor material and p-type IIB/VIB semiconductor material to the vapor of the halogen contain substance for a predetermined time at a specific temperature; and
    annealing the one or more layers of n-type IIB/VIB semiconductor material and p-type IIB/VIB semiconductor material that have been previously exposed to the vapor of the halogen containing substance.

34. A method as in claim 33, wherein:
    the temperature at which the one or more layers of n-type IIB/VIB semiconductor material and p-type IIB/VIB semiconductor material are exposed to the vapor of the halogen containing substance is suitable for depositing a film of the halogen containing substance upon the one or more layers of p-type IIB/VIB semiconductor material; and
    the step of annealing the one or more layers of n-type IIB/VIB semiconductor material and p-type IIB/VIB semiconductor material is performed at a temperature suitable for treating the one or more layers of n-type IIB/VIB semiconductor material and p-type IIB/VIB semiconductor material and removing the film of the previously deposited halogen containing substance.

35. A method as in claim 29, wherein the step of forming an ohmic contact on the treated one or more layers of p-type IIB/VIB semiconductor material comprises depositing a metal compound onto the treated one or more layers of type IIB/VIB semiconductor material and then annealing the treated one or more layers of p-type IIB/VIB semiconductor material.

36. A method as in claim 35, wherein the metal compound is a metal salt selected from the group comprising the salts of copper, silver, gold, tin, lead, antimony, and mercury.

37. A method as in claim 35, wherein the metal compound is an organometallic compound selected from the group comprising the organometallic compounds of copper, silver, gold, tin, lead, antimony, and mercury.

38. A method as in claim 29, further comprising the step of depositing an anti-reflective layer on an opposite surface of the substrate in the vacuum chamber.

39. A method as in claim 29, further comprising the step of treating the one or more layers of n-type IIB/VIB semiconductor material with a halogen containing substance prior to depositing the one or more layers of p-type IIB/VIB semiconductor material.

40. A method as in claim 39, wherein the halogen containing substance comprises cadmium chloride.

41. A method as in claim 39, wherein the step of treating the one or more layers of n-type IIB/VIB semiconductor material with a halogen containing substance comprises:

exposing the one or more layers of n-type IIB/VIB semiconductor material to the vapor of the halogen containing substance for a predetermined time at a specific temperature; and annealing the one or more layers of n-type IIB/VIB semiconductor material that has been previously exposed to the vapor of the halogen containing substance.

42. A method as in claim 39, wherein:

the temperature at which the one or more layers of n-type IIB/VIB semiconductor material is exposed to the vapor of the halogen containing substance is suitable for depositing a film of the halogen containing substance onto the one or more layers of n-type IIB/VIB semiconductor the step of annealing the one or more layers of n-type IIB/VIB semiconductor material is performed at a temperature suitable for treating the one or more layers of n-type IIB/VIB semiconductor material and removing the film of the preciously deposited halogen containing substance.

* * * * *